United States Patent
Xu et al.

(10) Patent No.: US 11,012,006 B2
(45) Date of Patent: May 18, 2021

(54) MICRO ELECTROMECHANICAL SYSTEM (MEMS) ENERGY HARVESTER WITH RESIDUAL STRESS INDUCED INSTABILITY

(71) Applicant: Massachusetts Institute of Technology, Cambridge, MA (US)

(72) Inventors: Ruize Xu, Cambridge, MA (US); Sang-Gook Kim, Wayland, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 624 days.

(21) Appl. No.: 15/769,258

(22) PCT Filed: Oct. 19, 2016

(86) PCT No.: PCT/US2016/057667
§ 371 (c)(1),
(2) Date: Apr. 18, 2018

(87) PCT Pub. No.: WO2017/070187
PCT Pub. Date: Apr. 27, 2017

(65) Prior Publication Data
US 2018/0316287 A1   Nov. 1, 2018

Related U.S. Application Data

(60) Provisional application No. 62/243,216, filed on Oct. 19, 2015.

(51) Int. Cl.
*H02N 2/18* (2006.01)
*H01L 41/113* (2006.01)
(Continued)

(52) U.S. Cl.
CPC ......... *H02N 2/188* (2013.01); *H01L 41/1134* (2013.01); *H01L 41/187* (2013.01);
(Continued)

(58) Field of Classification Search
CPC ..... H02N 2/188; H01L 41/187; H01L 41/193; H01L 41/1134; H01L 41/1871; H01L 41/1875; H01L 41/1876
See application file for complete search history.

(56) References Cited

U.S. PATENT DOCUMENTS 6,407,484 B1   6/2002   Oliver et al.
7,057,330 B2   6/2006   Buhler et al.
(Continued)

FOREIGN PATENT DOCUMENTS

WO   WO 2011/129855   10/2011

OTHER PUBLICATIONS

Cottone et al., "Piezoelectric buckled beams for random vibration energy harvesting"; IOP Publishing, Smart Mater, Struct. 21 (2012) 035021; 12 pages.
(Continued)

*Primary Examiner* — Shawki S Ismail
*Assistant Examiner* — Monica Mata
(74) *Attorney, Agent, or Firm* — Daly, Crowley, Mofford & Durkee LLP

(57) ABSTRACT

Described embodiments provide a Micro-Electro-Mechanical System (MEMS) vibration energy harvester. The energy harvester includes a buckled multi-layer beam that includes a plurality of stacked layers. The plurality of stacked layers includes at least one piezoelectric layer. Each one of the plurality of stacked layers has a determined stress level and a determined thickness. The determined stress level includes at least a compressive stress. The plurality of stacked layers achieves a desired total stress level of the beam to achieve substantial deformation of the beam in at least one direction when a proof mass is added to the beam. In response to applied external vibrations having a vibration frequency and an acceleration amplitude, the beam deflects and deforms to
(Continued)

provide strain to the at least one piezoelectric layer, thereby generating an electrical charge to provide a continuous power output in response to the external vibrations.

15 Claims, 15 Drawing Sheets

(51) Int. Cl.
    *H01L 41/187*     (2006.01)
    *H01L 41/193*     (2006.01)

(52) U.S. Cl.
    CPC ...... *H01L 41/1871* (2013.01); *H01L 41/1875* (2013.01); *H01L 41/1876* (2013.01); *H01L 41/193* (2013.01)

(56) References Cited

U.S. PATENT DOCUMENTS

| | | | |
|---|---|---|---|
| 7,436,104 | B2 | 10/2008 | Clingman et al. |
| 7,446,459 | B2 | 11/2008 | Xu et al. |
| 7,521,841 | B2 | 4/2009 | Clingman et al. |
| 2003/0197448 | A1 | 10/2003 | Tanielian |
| 2004/0075363 | A1 | 4/2004 | Malkin et al. |
| 2005/0012434 | A1 | 1/2005 | Pizzochero et al. |
| 2005/0120527 | A1 | 6/2005 | Tanielian |
| 2006/0255690 | A1 | 11/2006 | Rastegar et al. |
| 2008/0060919 | A1 | 3/2008 | Nakanishi |
| 2009/0085442 | A1 | 4/2009 | Kozinsky et al. |
| 2009/0167110 | A1 | 7/2009 | Berkcan et al. |
| 2009/0195222 | A1 | 8/2009 | Lu et al. |
| 2009/0212665 | A1 | 8/2009 | Koser et al. |
| 2009/0284102 | A1 | 11/2009 | Karakaya et al. |
| 2012/0068577 | A1 | 3/2012 | Koser et al. |
| 2014/0070670 | A1 | 3/2014 | Burgueno et al. |

OTHER PUBLICATIONS

Erturk et al., "Broadband piezoelectric power generation on high-energy orbits of the bistable Duffing oscillator with electromechanical coupling"; Journal of Sound and Vibration 330 (2011) 2339-2353; 15 pages; www.elsevier.com/locate4/jsvi.

Liu et al., "Novel piezoelectric bistable oscillator architecture for wideband vibration energy harvesting"; 16 pages; email: Weigun. liu@univ-savoir.fr.

Priedikman et al., "Nonlinear free and forced oscillations of piezoelectric microresonators"; published Jan. 13, 2006; Journal of Micromechanics and Microengineering; J. Micromech. Microeng. 16 (2006) 356-367; 13 pages.

Trigona et al.; "Nonlinear Mechanism in MEMS Devices for Energy Harvesting Applications" submitted on Jan. 12, 2011; Journal of Micromechanics and Microengineering, IOP Publishing, 2010, 12 pages.

PCT Search Report and Written Opinion dated Jan. 18, 2017; 11 pages.

Xu et al. "Wide Bandwidth Piezoelectric MEMS Energy Harvesting" dated on Sep. 16, 2016; MIT Libraries, Mater. Res. Soc. Symp. Proc.; Mechanical Engineering, MIT, Cambridge, MA, United States; vol. 1556 © 2013 Materials Research Society DOI: 10.1557/opl.2013. 4; 12 pages.

Xu et al., "MEMS Energy Harvesting from Low-frequency and Low-g Vibrations"; Mechanical Engineering Department, Massachusetts Institute of Technology; Cambridge, MA 02139, USA; Mater. Res. Soc. Symp. Proc. vol. 1782 © 2015 Materials Research Society; DOI: 10.1557/opl.2015.657; 6 pages.

Xu et al., "Low-Frequency, Low-G MEMS Piezoelectric Energy Harvester"; Department of Mechanical Engineering, Massachusetts Institute of Technology, Cambridge, MA 02139, USA; 5 pages.

204

| PASSIVATION LAYER(S) | 402 |
| ELECTRODE LAYER | 404 |
| PIEZOELECTRIC LAYER(S) | 406 |
| DIFFUSION BARRIER LAYER(S) | 408 |
| SEED LAYER(S) | 410 |
| STRUCTURAL LAYER(S) | 412 |

800

1200

1300

1400

1500

1600

1701

1700

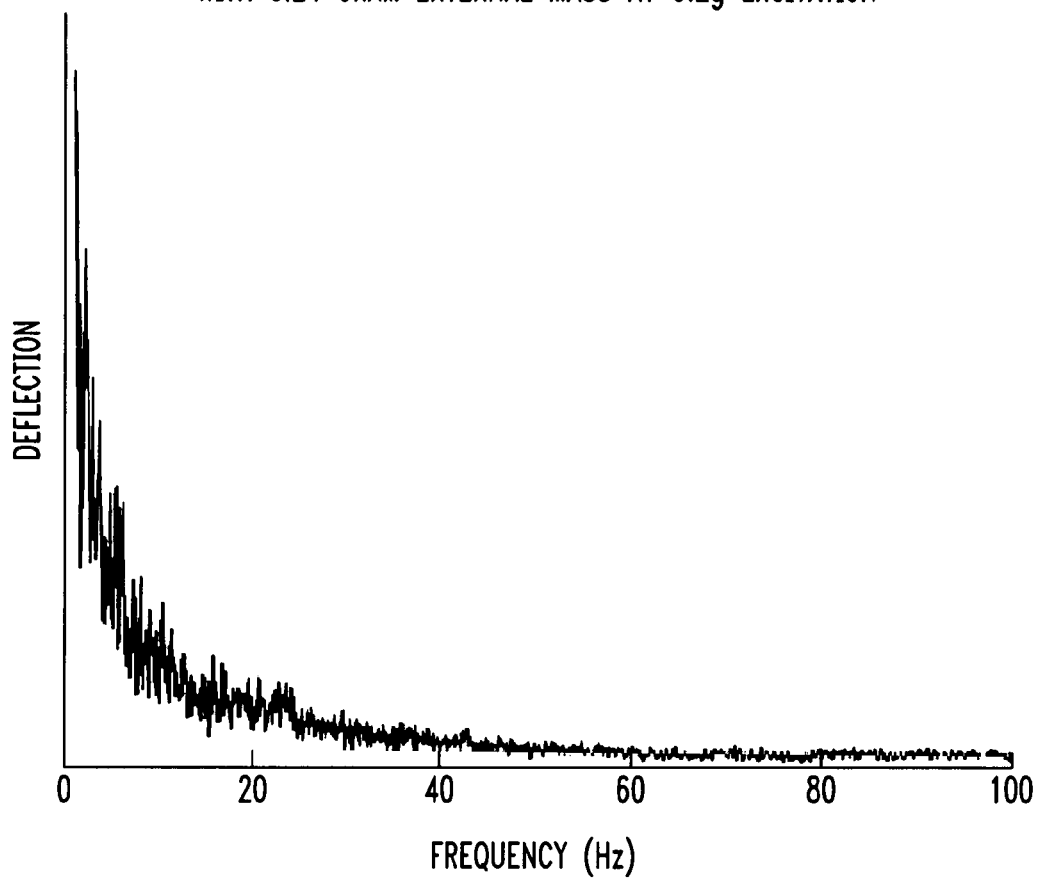

2000

MICRO ELECTROMECHANICAL SYSTEM (MEMS) ENERGY HARVESTER WITH RESIDUAL STRESS INDUCED INSTABILITY

CROSS REFERENCE TO RELATED APPLICATIONS

This application is a U.S. National Stage of PCT application PCT/US2016/057667 flied in the English language on Oct. 19, 2016, and entitled "MICRO ELECTROMECHANICAL SYSTEM (MEMS) ENERGY HARVESTER WITH RESIDUAL STRESS INDUCED INSTABILITY," which claims the benefit under 35 U.S.C. § 119 of provisional application No. 62/243,216 filed Oct. 19, 2015, which application is hereby incorporated herein by reference.

BACKGROUND

Wireless devices are frequently employed in many different application fields such as mobile communications, healthcare, automotive, and predictive maintenance. However, such devices may have limited lifetime due to power required for operation. Increased lifetime may be achieved via energy harvesting techniques in which mechanical energy (e.g., motion or vibration) is transformed into electrical energy.

One type of energy harvesting may employ micro electromechanical systems (MEMS) to harvest energy from vibrations. Most current MEMS energy harvesters employ linear cantilever resonator structures to amplify relatively small ambient vibrations (e.g., low frequency, low g-force). However, MEMS-scale devices typically operate at higher frequency (e.g., due to smaller size). Further, such structures typically operate over a narrow bandwidth of vibration frequencies. Additionally, large magnetic components, which may be effective for use in physically large energy harvesters are generally not suitable for use in MEMS-scale devices (e.g., due to physical size, weight, magnetic interference, etc.). Therefore, an improved MEMS-scale energy harvester is needed.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

One aspect provides a Micro-Electro-Mechanical System (MEMS) vibration energy harvester. The energy harvester includes a buckled multi-layer beam that includes a plurality of stacked layers. The plurality of stacked layers includes at least one piezoelectric layer. Each one of the plurality of stacked layers has a determined stress level and a determined thickness. The determined stress level includes at least a compressive stress. The plurality of stacked layers achieves a desired total stress level of the buckled multi-layer beam to achieve substantial deformation of the buckled multi-layer beam in at least one direction when a proof mass is added to the beam. In response to applied external vibrations having a vibration frequency and an acceleration amplitude, the buckled multi-layer beam deflects and deforms to provide strain to the at least one piezoelectric layer, thereby generating an electrical charge to provide a continuous power output in response to the external vibrations.

In an embodiment, a first subset of the plurality of layers comprise transduction layers, a second subset of the plurality of layers comprise electrode layers, and a third subset of the plurality of layers comprise substrate layers. In an embodiment, the multi-layer beam is suspended from a base frame, the base frame thicker than the multi-layer beam, the base frame configured to provide support to the multi-layer beam during vibration, and wherein the multi-layer beam comprises the proof mass proximate to a center of the multi-layer beam. In an embodiment, the buckled multi-layer beam is configured to achieve bi-stable non-linear oscillation in response to the external vibrations. In an embodiment, the energy harvester is configured to generate at least 100 µW continuous power in response to the external vibrations.

In an embodiment, the transduction layers comprise at least one piezoelectric layer comprising piezoelectric material. In an embodiment, the piezoelectric material is selected from the group consisting of: lead zirconate titanate (PZT), barium titanate (BaTiO3), zinc oxide (ZnO), aluminum nitride (AlN), polyvinylidene difluoride (PVDF), and lead magnesium niobate-lead titanate (PMN-PT). In an embodiment, the transduction layers comprise one or more support layers, the support layers comprising one of a seed layer and a diffusion barrier.

In an embodiment, the determined stress level and the determined thickness are selected to induce buckling of the multi-layer beam when a total compression in the multi-layer beam is higher than a critical buckling load of the multi-layer beam. In an embodiment, the determined stress level and the determined thickness are selected to achieve symmetric distribution of stress across the multi-layer beam with respect to a neutral axis of the multi-layer beam, thereby enabling the multi-layer beam to buckle in two directions.

In an embodiment, the plurality of layers comprises one or more passivation layers, one or more active layers, one or more diffusion barriers, one or more substrate layers, one or more electrode layers, and one or more seed layers, the plurality of layers having a total thickness less than approximately 4 µm.

In an embodiment, the energy harvester comprises a suspended structure comprising one or more rows, each row comprising one or more multi-layer beams, each multi-layer beam having a (length/thickness) aspect ratio higher than $10^3$.

In an embodiment, each multi-layer beam has a width dimension selected to reduce buckling in a direction lateral to the multi-layer beam, while allowing buckling in a direction longitudinal to the multi-layer beam.

In an embodiment, the multi-layer beams are coupled to the proof mass to thereby reduce a rotation of the suspended structure about a rotation axis in relation to the longitudinal direction of the multi-layer beams.

In an embodiment, a material of each of the plurality of layers is selected from the group consisting of: silicon, silicon dioxide, silicon nitride, gold, titanium, platinum, copper, aluminum, silver, tungsten, piezoelectric material, plastic, polymers, and zirconium dioxide, and wherein each of the plurality of layers has a thickness in the range of approximately 10 nm to approximately 50 µm.

BRIEF DESCRIPTION OF THE DRAWING FIGURES

Other aspects, features, and advantages of the concepts, systems, circuits and techniques described herein will become more fully apparent from the following detailed description, the appended claims, and the accompanying drawings in which like reference numerals identify similar or identical elements. Reference numerals that are introduced in the specification in association with a drawing figure may be repeated in one or more subsequent figures without additional description in the specification in order to provide context for other features. The drawings are not necessarily to scale, emphasis instead being placed on the concepts disclosed herein.

FIG. 18 is a plot showing deflection amplitude versus frequency of vibration applied to the multi-layer beam of the MEMS vibration energy harvester of FIG. 1 with an external proof mass, in accordance with an illustrative embodiment;

DETAILED DESCRIPTION

Figure 1:
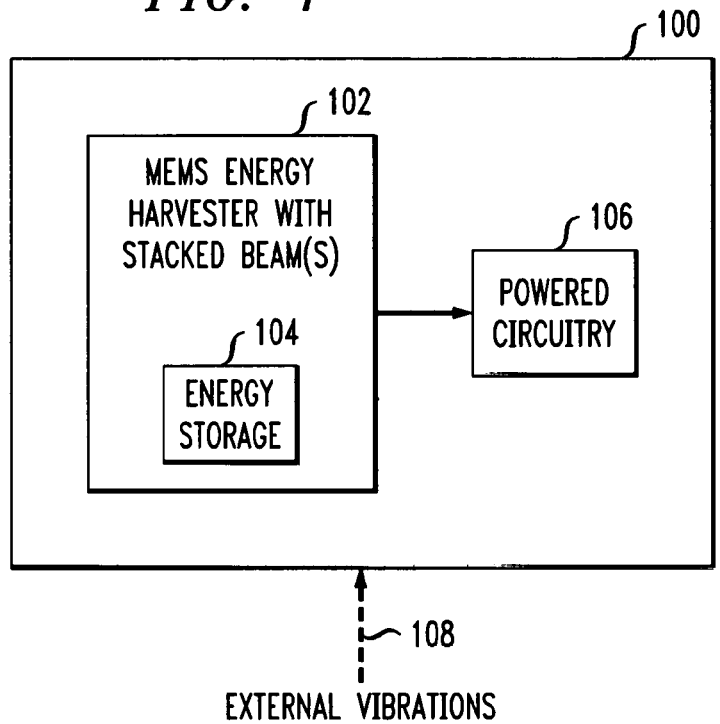
FIG. 1 is a block diagram of a Micro-Electro-Mechanical System (MEMS) vibration energy harvester system in accordance with an illustrative embodiment.

As will be described herein, described embodiments provide a Micro-Electro-Mechanical System (MEMS) vibration energy harvesting system to provide energy to low-power microelectronic systems and potentially enable batteryless autonomous systems by generating energy based upon external vibration of the system. The described MEMS vibration energy harvesters have small physical size, allowing the MEMS energy harvesters to be embedded in small electronic systems, such as mobile devices. In some embodiments, piezoelectric energy harvesting may be employed to convert kinetic energy of ambient vibrations to electrical power.

The MEMS energy harvester described herein employs one or more micro-fabricated thin film beams having at least a compressive residual stress to achieve a bi-stable energy harvester suitable for low frequency, low amplitude (e.g., low g) vibration energy harvesting. In described embodiments, the compressive residual stress in micro-fabricated thin films may be employed to induce buckling in doubly clamped or clamped-clamped beams. The clamped-clamped beams are bi-stable (e.g., have two equilibrium points) and snap through at low frequencies to achieve increased power generation.

Conventional systems typically achieve bi-stability by employing magnetic force, forced compression, or pre-shaped curved beams. However, such solutions are not suitable for MEMS applications, since magnets are large; forced compression cannot be easily implemented at MEMS scale, and pre-shaped curved beams experience in-plane oscillations making them unsuitable for use with piezoelectric material for energy harvesting. Described embodiments employ pure mechanical bi-stability of a buckled beam to achieve energy generation at MEMS scale from low-frequency vibrations.

For example, described embodiments of MEMS energy harvesters may employ compression induced bi-stability nonlinear resonance of one or more thin film beams. Such beams may achieve either of two oscillation responses depending on the input vibration amplitude. Both oscillation responses may be relatively wider-bandwidth and have lower frequency range than conventional systems. At high vibration amplitude (e.g., high g) input, described bi-stable embodiments may achieve a stiffening response that shifts to lower frequency, and at low vibration amplitude (e.g., low g) input, described bi-stable embodiments may achieve a softening response that generates higher power with wider bandwidth than conventional systems.

For example, in described embodiments, the energy harvester may be able to harvest energy from external vibrations having a lower frequency and acceleration amplitude than conventional systems. For example, some described embodiments may achieve a MEMS energy harvester able to generate approximately 100 µW continuous power from ambient external vibrations having a vibration frequency less than approximately 100 Hz and an acceleration amplitude of less than approximately 0.5 g with reasonably wide bandwidth (>20%).

Some embodiments may employ a proof mass coupled to the beam(s). As will be described, some embodiments achieve an operating range for vibrations having frequencies from 50 Hz to 150 Hz and accelerations of approximately 0.2 g without an external proof mass. Some embodiments employ an external proof mass to achieve a lower frequency range (<10 Hz) with boosted deflection amplitude.

Referring to FIG. 1, a block diagram of illustrative MEMS energy harvester system 100 is shown. As shown in FIG. 1, system 100 may include a microelectronic circuit including powered circuitry 106. Powered circuitry 106 may include, for example, one or more microprocessors, one or more wired or wireless transceivers, one or more sensors, and/or other elements requiring electric power to operate. Powered circuitry 106 is coupled to, and receives power from, MEMS energy harvester 102. As shown in FIG. 1, MEMS energy harvester 102 may be implemented having one or more stacked beams, as will be described in greater detail herein. MEMS energy harvester 102 may generate power in response to external vibrations 108 that are applied to system 100. In some embodiments, MEMS energy harvester 102 may include energy storage 104. Energy storage 104 may include, for example, capacitors, supercapacitors, rechargeable batteries, or other similar energy storage elements.

Figure 2:
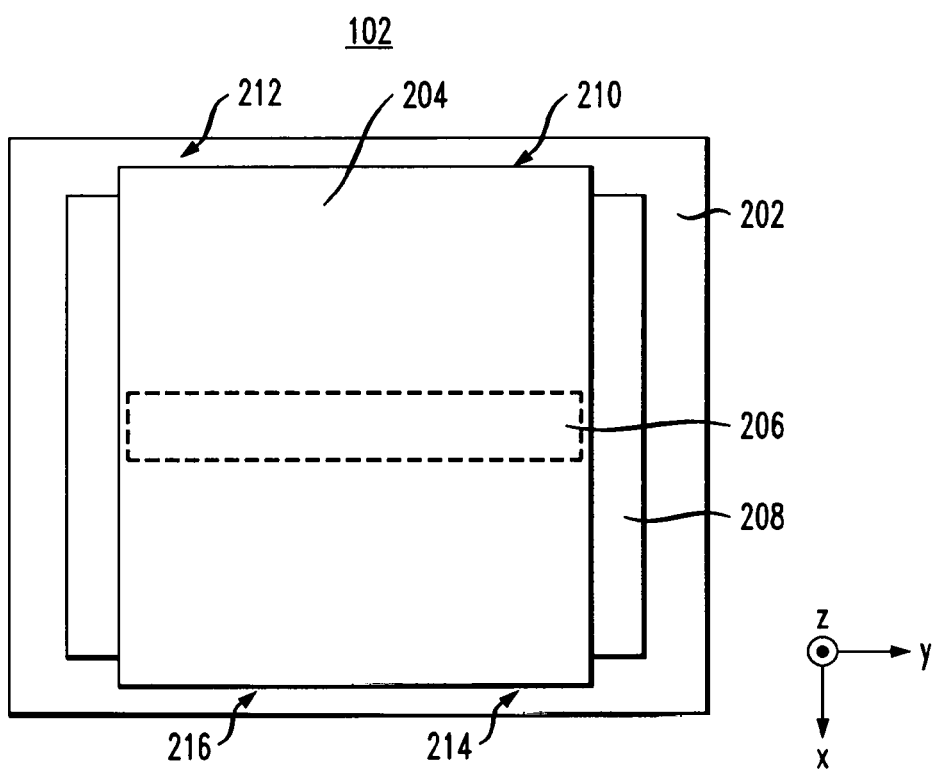
FIG. 2 is top view of a multi-layer beam of the MEMS vibration energy harvester of FIG. 1, in accordance with an illustrative embodiment.

Referring to FIG. 2, a top view of a thin film clamped-clamped beam 206 is shown. MEMS energy harvester 102 may include one or more clamped-clamped beams 204. In general, beam 204 may have a square or rectangular cross section, although other shapes may be employed. Beam 204 is disposed in an x-y-z Cartesian coordinate system as shown. As shown in FIG. 2, beam 204 is clamped or attached to a first end 210 to a first portion 212 of frame 202, and is clamped or attached to a second end 214 to a second portion 216 of frame 202. In some embodiments, first portion 212 and second portion 216 of frame 202 are opposing sides of frame 202. In some embodiments, frame 202 may be square or rectangular, although other shapes, including, but not limited other regular geometric shapes or irregular shapes, may be employed. Frame 202 may have an opening 208 to allow movement of beam 204 along the z-axis in response to external vibrations. In some embodiments, beam 204 may be coupled to a proof mass 206. In an embodiment, proof mass 206 has a mass less than or equal to 0.1 grams. In response to applied external vibrations having a vibration frequency less than approximately 100 Hz and an acceleration amplitude of less than approximately 0.5 g, described embodiments of beam 204 deflect and deform to provide strain to the beam (e.g., to a piezoelectric layer of beam 204) and, thus, generate an electrical charge.

In some embodiments, beam 204 is a buckled clamped-clamped multi-layer beam with at least one embedded piezoelectric layer and proof mass 206 located proximate to a center of beam 204. For example, referring to FIG. 3, an isometric view of illustrative beam 204 shows that beam 204 is clamped or attached to a first end 210 to a first portion 212 of frame 202, and is clamped or attached to a second end 214 to a second portion 216 of frame 202. Opening 208 in frame 202 allows movement of beam 204 and proof mass 206 along the z-axis in response to external vibrations.

Figures 3, 4:
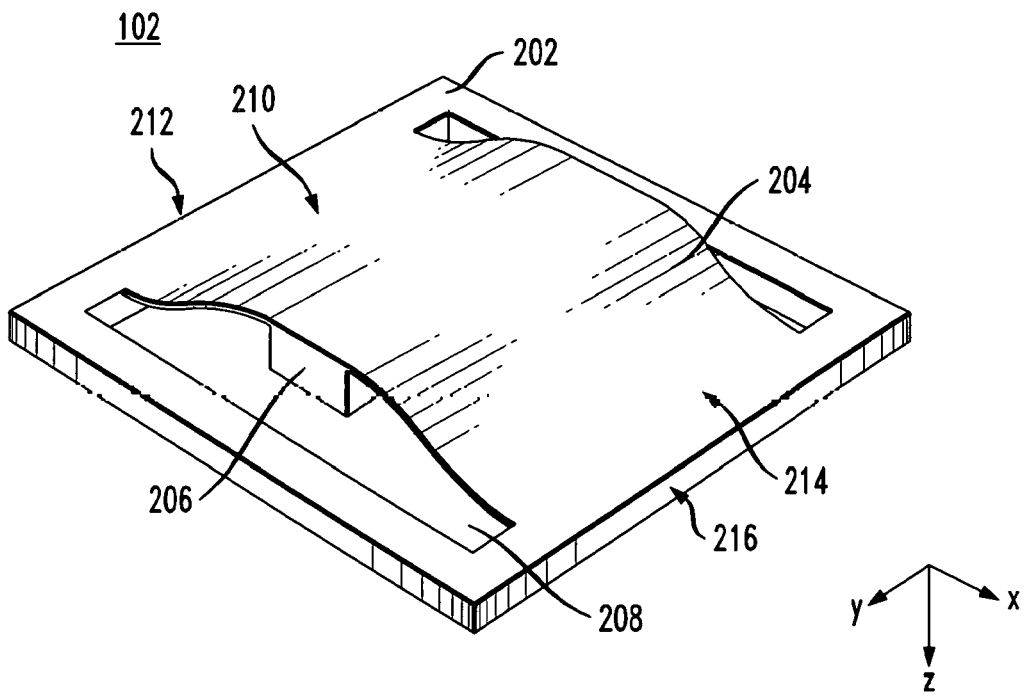
FIG. 3 is an isometric view of the multi-layer beam of the MEMS vibration energy harvester of FIG. 1, in accordance with an illustrative embodiment.
FIG. 4 is a side view of a multi-layer beam of the MEMS vibration energy harvester of FIG. 1, in accordance with an illustrative embodiment.

Referring to FIG. 4, a side-view of an illustrative embodiment of beam 204 is shown. As shown in FIG. 4, beam 204 may include a plurality of layers. For example, beam 204 may include a plurality of thin film layers. As shown in FIG. 4, beam 204 may include one or more layers to achieve a specific function of beam 204. For example, as shown in FIG. 4, beam 204 may include one or more passivation layers 402, one or more electrode layers 404, one or more piezoelectric layers 406, one or more diffusion barrier layers 408, one or more seed layers 410 and one or more structural layers 412.

Figure 5:
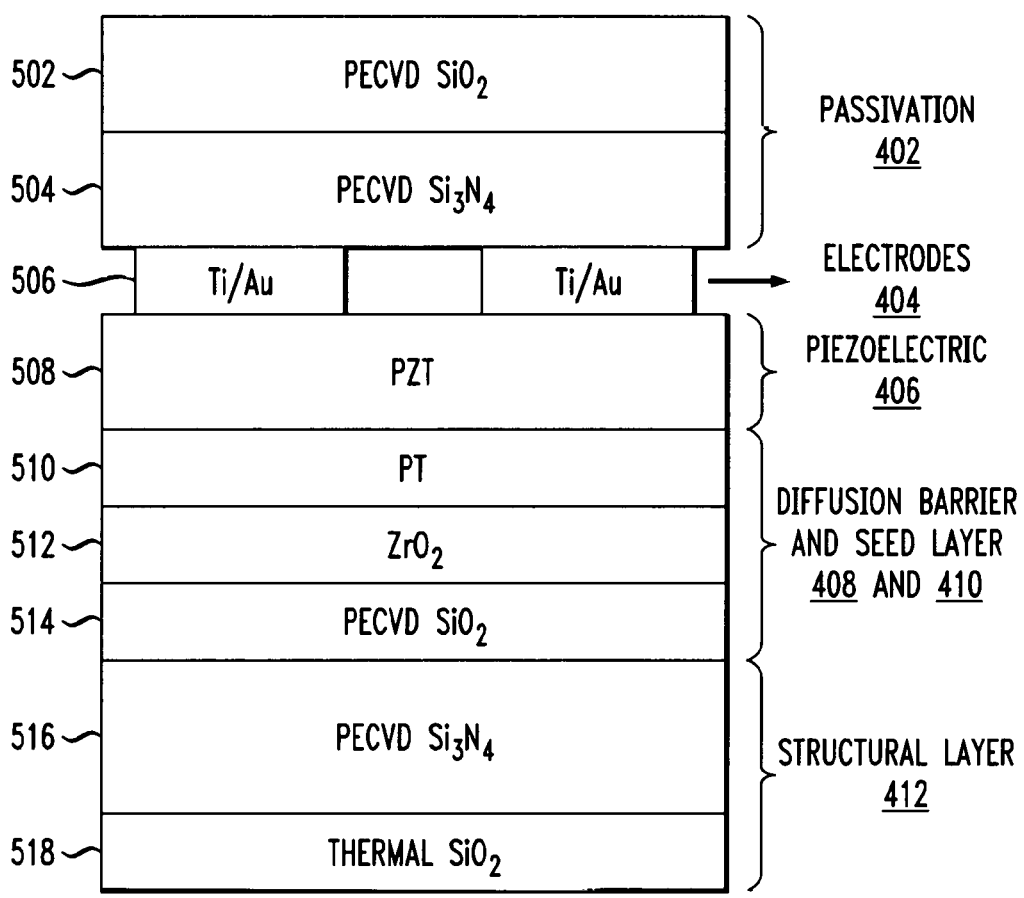
FIG. 5 is another side view of the multi-layer beam of FIG. 4, in accordance with an illustrative embodiment.

Referring to FIG. 5, an illustrative arrangement of layers of beam 204 is shown. As shown in FIG. 5, passivation layer 402 may include a first passivation layer 502 and a second passivation layer 504. In the illustrative embodiment shown in FIG. 5, first passivation layer 502 is implemented using silicon dioxide, and second passivation layer 504 is implemented using silicon nitride. Electrode layer 404 may include one or more electrodes (for example, interdigitated electrodes), shown generally as electrodes 506. In the illustrative embodiment shown in FIG. 5, electrodes 506 may be implemented using titanium or gold, although other materials may be used, for example, copper, aluminum, tungsten, or any material having suitable electrical conductivity. Piezoelectric layer 406 may include one or more layers of piezoelectric material 508. In the illustrative embodiment shown in FIG. 5, piezoelectric material 508 may be lead zirconate titanate (PZT), although other materials may be used, for example, barium titanate ($BaTiO_3$), zirconium oxide ($ZrO_2$), zinc oxide (ZnO), aluminum nitride (AlN), polyvinylidene difluoride (PVDF), or lead magnesium niobate-lead titanate (PMN-PT).

In the illustrative embodiment shown in FIG. 5, diffusion barrier layer 408 and seed layer 410 may include first layer 510, second layer 512 and third layer 514. In the illustrative embodiment shown in FIG. 5, passivation layer 402, diffusion barrier layer 408, seed layer 410 and structural layer 412 may be implemented using materials such as silicon, silicon dioxide, silicon nitride, zirconium dioxide, or other materials.

Figure 7:
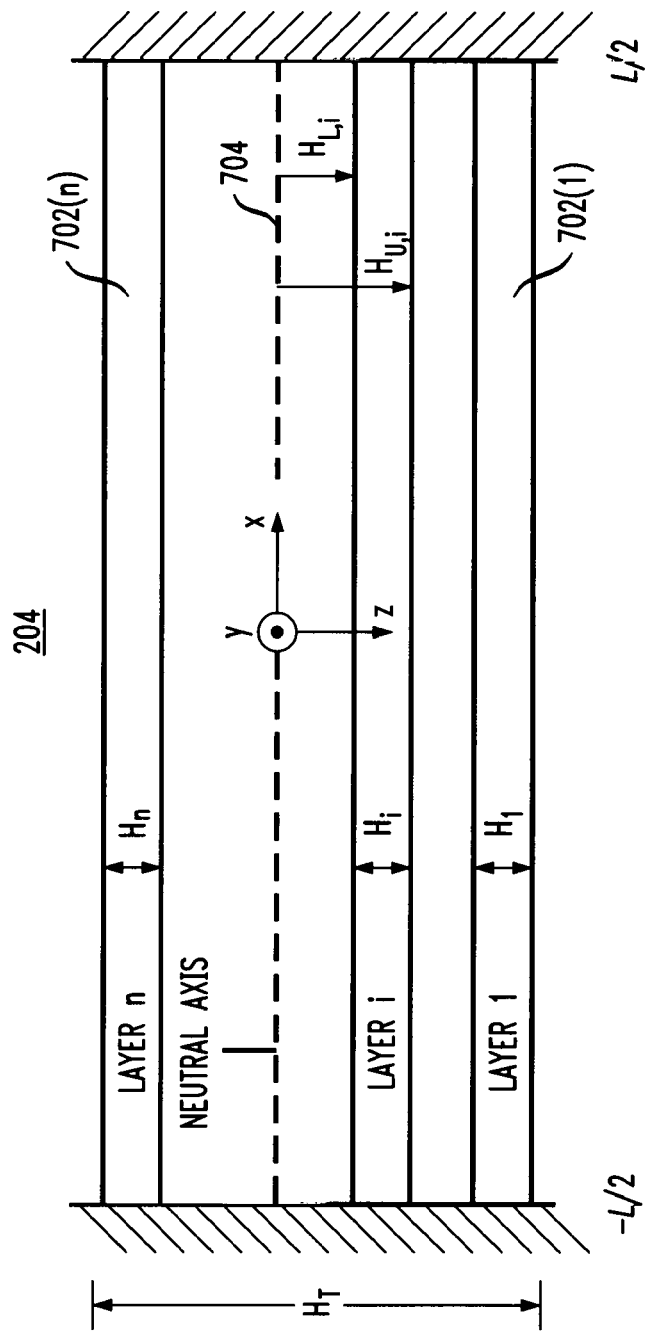
FIG. 7 is another side view of the multi-layer beam of FIG. 4, in accordance with an illustrative embodiment.

As indicated in the illustrative embodiment shown in FIG. 5, one or more of the layers of beam 204 may be implemented as thin film layers deposited on a substrate, for example by plasma-enhanced chemical vapor deposition (PECVD), Low-Pressure Chemical Vapor Deposition (LPCVD), or other thin-film techniques. Other layers may be produced by other microfabrication techniques, for example, etching or thermal oxidation. Thus, described embodiments may be implemented using micro-fabrication techniques and PZT spin-coating. The overall effect of the residual stress in different layers is employed to compress beam 204 to induce buckling and bi-stability. Thermal dioxide, LPCVD or PECVD silicon nitride could have compressive stresses, which can be tuned by changing the gas ratio or plasma frequency during fabrication. After measuring the residual stress in each material, the thicknesses of the stack of thin films can be designed and controlled (e.g., via the deposition rates during fabrication), to achieve buckling of beam 204 and symmetrically distribute stress in beam 204 with respect to the neutral axis (e.g., as shown in FIG. 7). In some embodiments, deep reactive ion etching (DRIE) may be employed to define the beam and a proof mass on the backside of the beam. Some embodiments may employ a flexible substrate, for example made from plastic or polymers, while other embodiments may employ a rigid substrate, for example made from silicon.

Figure 6:
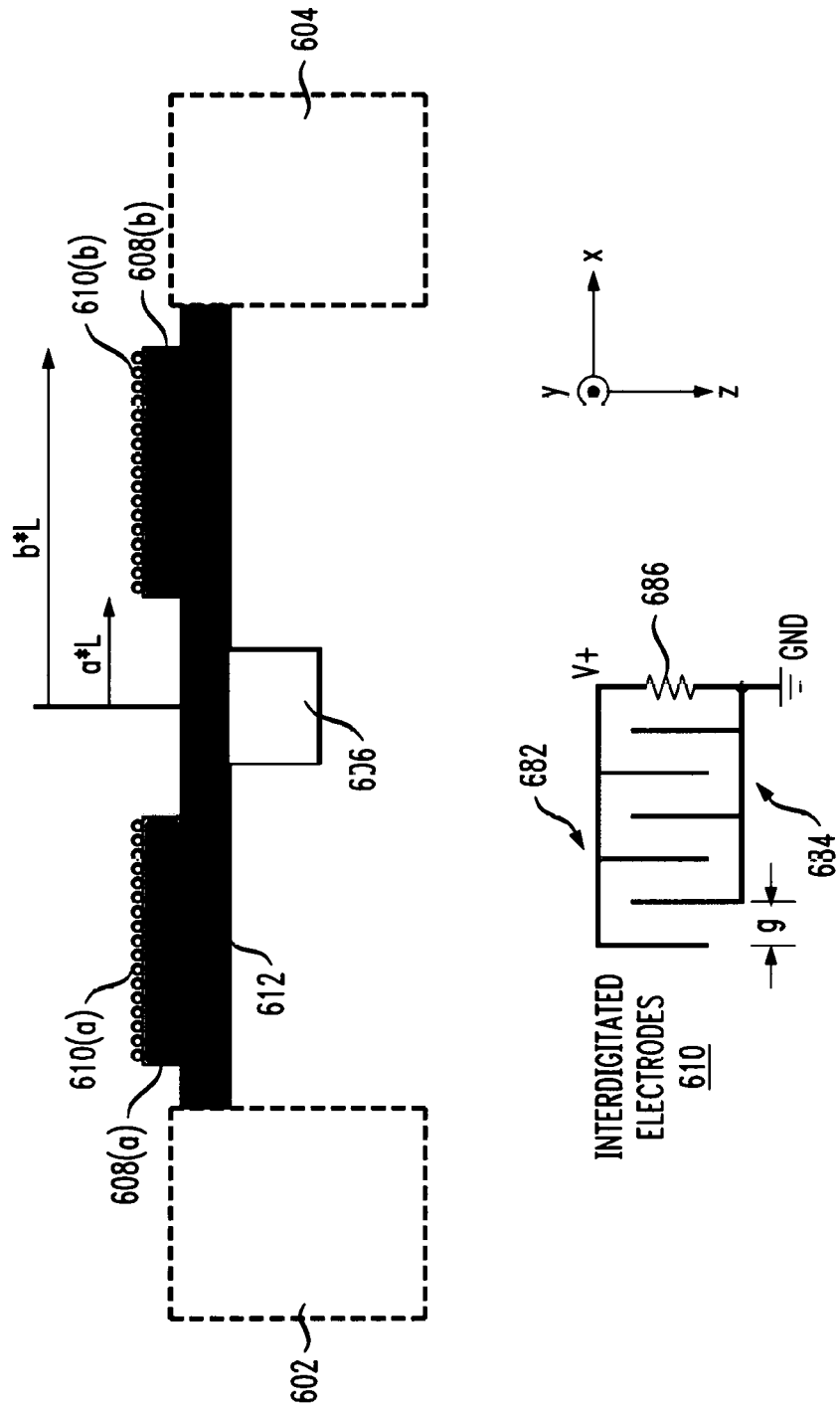
FIG. 6 is a side view of the MEMS vibration energy harvester of FIG. 1, in accordance with an illustrative embodiment.

Referring to FIG. 6, a side view of illustrative MEMS energy harvester 600 is shown. As shown, MEMS energy harvester 600 includes beam structural layer 612 which is coupled to frame portions 602 and 604. Proof mass 606 is coupled to beam structural layer (or substrate) 612. In the illustrative embodiment shown in FIG. 6, MEMS energy harvester 600 includes a first piezoelectric layer 608(a) and a second piezoelectric layer 608(b). In some embodiments, first piezoelectric layer 608(a) and second piezoelectric layer 608(b) are disposed on beam structural layer 612 symmetrically on opposite sides of proof mass 606, such as shown in FIG. 6. For example, as shown in FIG. 6, piezoelectric layers 608 and electrode layers 610 span symmetrically from −b*L to −a*L (608(a) and 610(a)) and from a*L to b*L (608(b) and 610(b)) on structural layer 612.

Disposed on one side of each of first piezoelectric layer 608(a) and second piezoelectric layer 608(b) are corresponding first and second electrode layers 610(a) and 610(b), referred to generally as electrode layer 610. In some embodiments, electrode layer 610 may be implemented as a plurality of interdigitated electrodes, as shown in FIG. 6. For example, piezoelectric layers 608 may operate in d33 mode with electrode layer 610 implemented as interdigitated electrodes disposed on or proximate to a top side of piezoelectric layers 608. Electrode layer 610 may include one or more first electrodes 682 associated with a positive supply voltage V+ of energy harvester 102 that are interdigitated with one or more second electrodes 684 associated with a common or negative supply voltage GND of energy harvester 102. A load resistance 686 may be coupled between the positive voltage V+ and the common or negative voltage GND. Load resistance 686 may represent circuit elements powered by energy harvester 102 (e.g., powered circuitry 106).

Referring to FIG. 7, another illustrative view of beam 204 is shown. As shown in FIG. 7, beam 204 may have n layers of different material thin films with various thicknesses, shown as layers 702(1) to 702(n). Beam 204 vibrates up and down with respect to the Z-axis and has a neutral position indicated by neutral axis line 704. As will be described in greater detail below, each layer may have a selected thickness and material to achieve specific functions and to achieve a desired overall performance of beam 204. For example, the thickness of each layer may be selected based upon a desired transduction, a desired charge collection, a desired frequency range, a desired acceleration amplitude range, or a desired power output of the energy harvester.

As shown in FIG. 7, beam 204 has an overall thickness, HT. In one embodiment, HT is less than 4 μm and the thickness of each of the layers is in the range of 10 nm to 3000 nm. As will be described in greater detail below, beam 204 may be constructed having a length/thickness aspect ratio in the order of $10^2$ to $10^3$. Further, a width of beam 204 (e.g., along the y-axis) may be selected to reduce corrugation in a direction lateral to the beam (e.g., along the y-axis), while allowing buckling in a direction longitudinal to the beam (e.g., along the x-axis). In one embodiment, the width of beam 204 is less than or equal to 0.3 mm.

Figure 8:
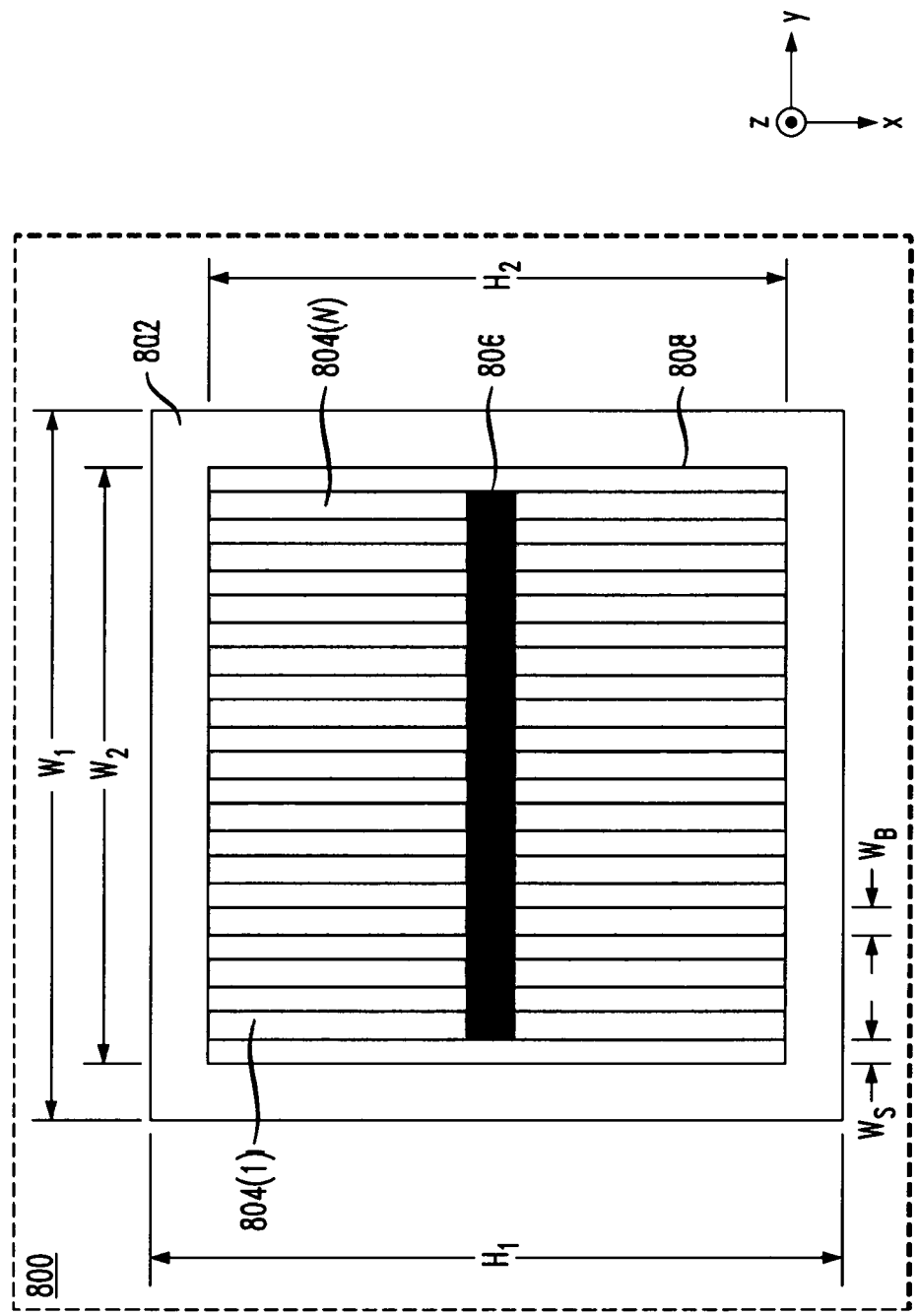
FIG. 8 is a top view of an array of multi-layer beams of the MEMS vibration energy harvester of FIG. 1, in accordance with an illustrative embodiment.

Referring to FIG. 8, some embodiments of MEMS energy harvester 102 may include a plurality of beams in an array, such as beam array 800 shown in FIG. 8. Beam array 800 includes a frame 802 having an opening 808. As shown, beam array 800 may include N beams, shown as beams 804(1) to 804(N). In some embodiments, each of the N beams may be coupled to a single proof mass 806. Coupling each of the N beams to a single proof mass reduces a rotation of the frame about a rotation axis in relation to the longitudinal direction of the beams (e.g., the y-axis). In alternative embodiments, each of the N beams may be coupled to a separate proof mass (not shown). Each of the N beams are disposed between sides of frame 802 such that opening 808 allows movement of each of the beams along the z-axis. As shown, frame 802 may be square or rectangular, although other shapes may also be employed.

As shown in FIG. 8, frame 802 has a height $H_1$ and a width $W_1$. Opening 808 has a height $H_2$ and a width $W_2$. Each beam 804 has a width $W_B$. Adjacent beams are separated by a distance $W_S$. In one embodiment, $H_1$ and $W_1$ may be equal to 18 mm and $H_2$ and $W_2$ may be equal to 15 mm, $W_S$ may be equal to 0.1 mm and $W_B$ may be equal to 0.3 mm. Although the dimension is not shown in FIG. 8, in an embodiment, frame 802 may have a thickness of 530 μm. Other embodiments may employ smaller dimensions. For example, in another embodiment, the frame has a structural size less than 15 mm×14 mm×4 μm.

Figure 9:
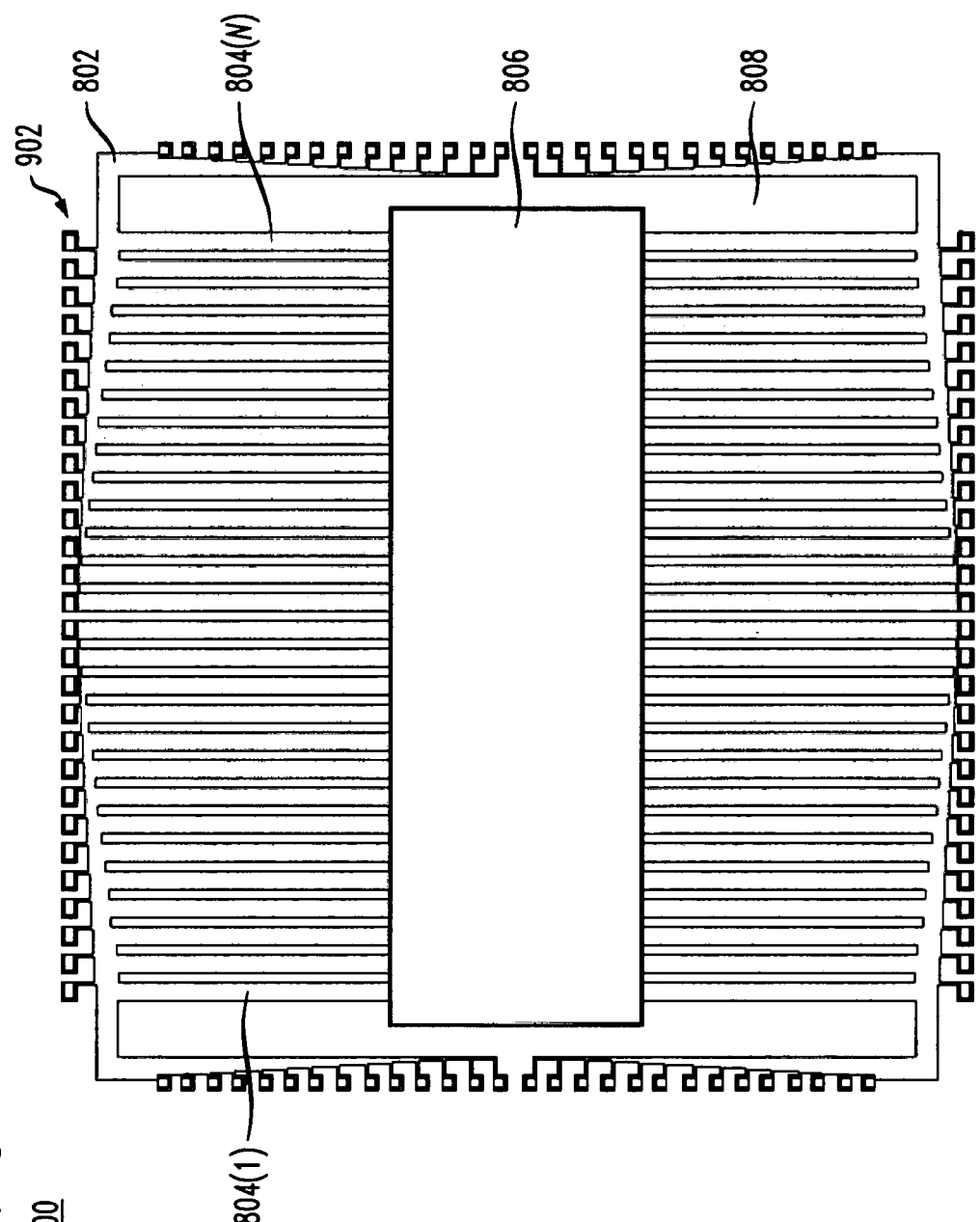
FIG. 9 is another top view of an array of multi-layer beams of the MEMS vibration energy harvester of FIG. 1, in accordance with an illustrative embodiment.

Referring to FIG. 9, in some embodiments, beam array 800 may be implemented with a plurality of contact pads 902. Contact pads 902 may allow beam array 800 to be securely coupled to a carrier of system 100. For example, contact pads 902 may allow beam array 800 to be soldered to a printed circuit board of system 100. Further, contact pads 902 may provide electrical connections between beam array 800 and system 100, for example to provide voltages V+ and GND to powered circuitry 106.

Figure 10:
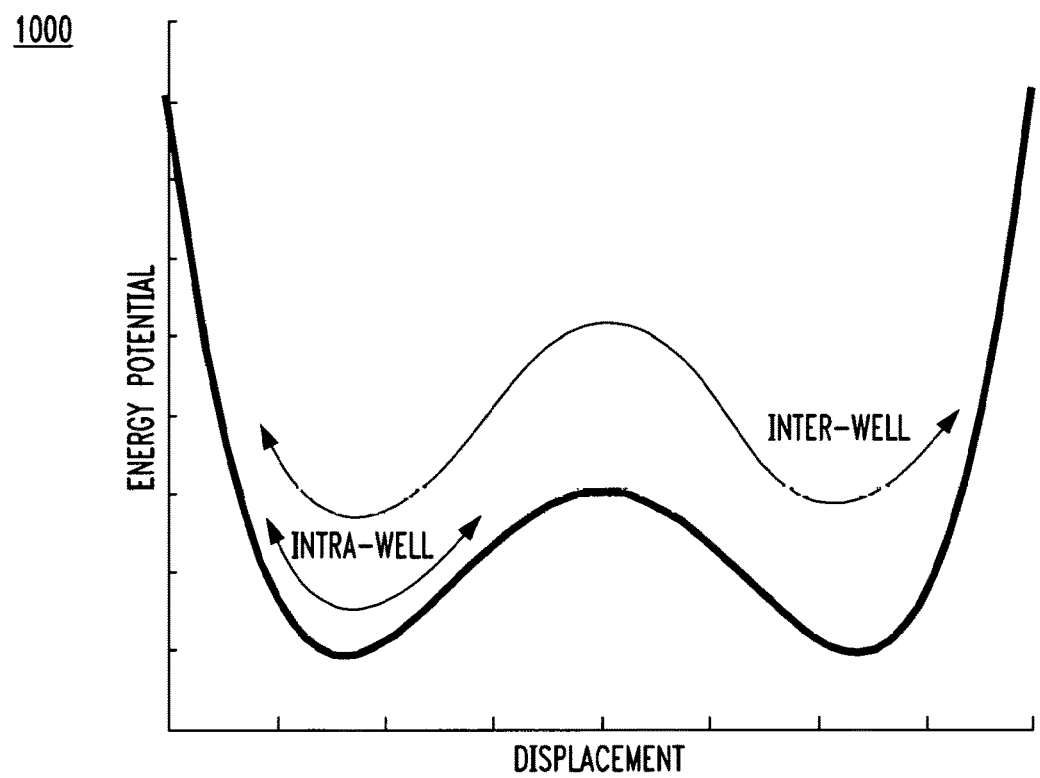
FIG. 10 is a plot showing energy potential versus displacement of the multi-layer beam of the MEMS vibration energy harvester of FIG. 1, in accordance with an illustrative embodiment.

Referring to the multi-layer beam shown in FIGS. 2-7, and the beam array shown in FIGS. 8 and 9, and as will be described in greater detail herein, compressive stresses of the thin film layers of the beam (e.g., beam 204) induce bi-stability such that beam 204 buckles when compressive stress in the beam exceeds the critical load of the beam. For example, beam 204 may have buckled up and buckled down stable equilibria points. As described herein, beam 204 may include an elastic substrate and one or more piezoelectric elements. Compressive stresses are applied to at least some layers of beam 204 so that the linear stiffness $k_L$ is negative and the beam is bi-stable with a double-well potential such as shown in FIG. 10. The linear stiffness of a single layer beam structure is expressed as:

$$k_L = \left[\frac{\pi^4 EWH^3}{6L^3}\right] + \left[\frac{\pi^2 T_0 WH}{2L}\right] \quad (1)$$

where W, H and L are the width, thickness (height) and length of the beam, and $T_0$ is the pre-stress in the beam. When the negative $T_0$ is large enough, the total linear stiffness $k_L$ of the beam is negative. It is also assumed that the piezoelectric element is in $d_{33}$ mode (e.g., of the piezoelectric coefficient).

The dynamic response of the beam with nonlinear resonance and bi-stability is formulated using Lagrangian method. The governing equations of the mechanical and electrical domains are obtained from the single degree-of-freedom lumped model, $$m\ddot{w} + k_L w + k_N w^3 + b\dot{w} + C_N w V_N + C_L V_L = F \quad (2)$$

$$C_0 \dot{V}_L + \frac{V_L}{R} + C_0 \dot{V}_N + \frac{V_N}{R} = I_L + I_N \quad (3)$$

where m, $k_L$, $k_N$, b and F are the proof mass, linear stiffness, nonlinear stiffness, mechanical damping coefficient, and excitation force, $C_L$ and $C_N$ are constants that couple the two domains in linear and nonlinear relations respectively, $C_O$ and R are the internal capacitance of the piezoelectric element and the load resistance, and V and I are the generated voltage and current. The subscripts L and N denote the linear and nonlinear responses. The linear and nonlinear electrical signals are separated due to the fact that they are harmonic signals with different frequencies and phases.

Figure 11:
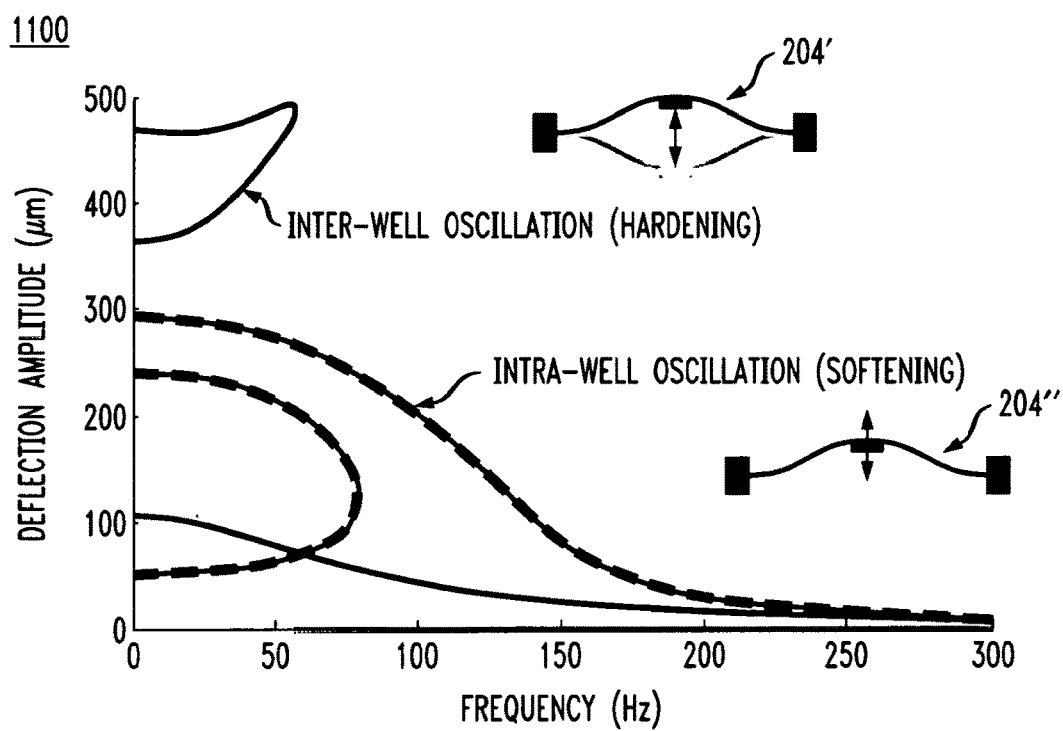
FIG. 11 is a plot showing deflection amplitude versus frequency of vibration applied to the multi-layer beam of the MEMS vibration energy harvester of FIG. 1, in accordance with an illustrative embodiment.

These parameters of Equations 2 and 3 are functions of the device dimensions and material properties. The nonlinear differential equations can be solved analytically using the harmonic balance method, so that the dynamic responses of the post-buckling beam are obtained. The softening and stiffening (or hardening) responses corresponding to the intra-well and inter-well oscillations are shown in FIG. 11. The large-amplitude snapping of inter-well stiffening response increases the velocity of the beam oscillation significantly which enhances the power generation at low frequencies.

By assuming the external force is a harmonic function, and using harmonic balance method to solve the nonlinear differential equations, the deflection and associated output voltages and currents can be determined. The frequency response of the beam midpoint deflection is shown in FIG. 11, which shows that the bi-stable system oscillation within the potential well (intra-well oscillations as shown by illustrative beam 204") and oscillation across the two potential wells shown in FIG. 10 (inter-well oscillations as shown by illustrative beam 204'), which can be identified as the characteristic softening and stiffening of Duffing mode resonance responses.

Depending on the input vibration amplitude, bi-stable beams could have either oscillation mode: when the input vibration amplitude is less than the energy barrier between the two potential wells, the beam will oscillate at a small amplitude around one of the buckled configuration and show a softening response. Alternatively, when the input vibration amplitude is large enough to overcome the energy barrier between the two potential wells, the beam snaps through and has a large-amplitude oscillation with a stiffening response at low frequencies.

Figure 12:
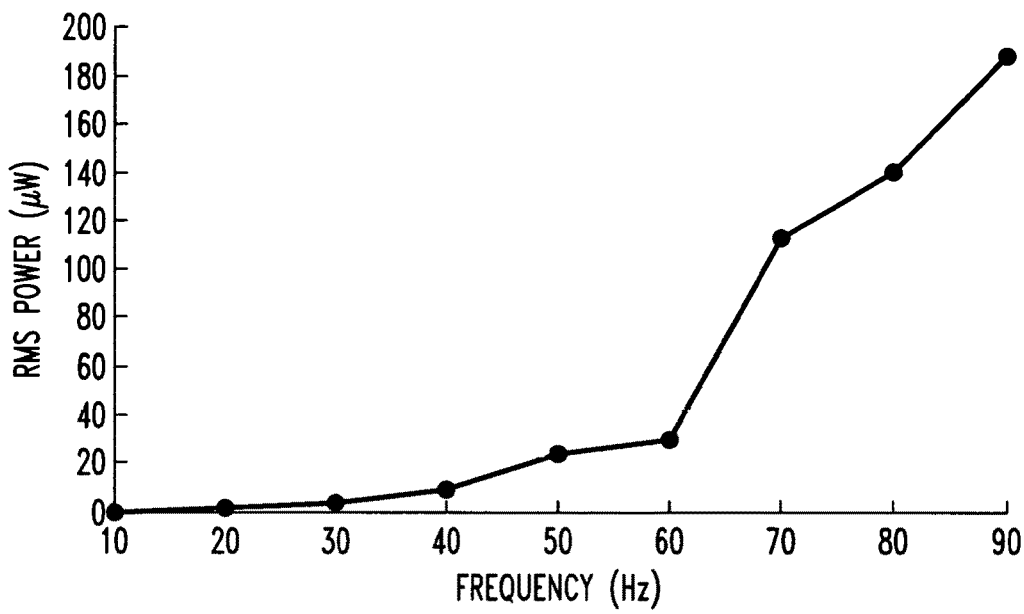
FIG. 12 is a plot showing root mean square (RMS) power output versus frequency of vibration applied to the multi-layer beam of the MEMS vibration energy harvester of FIG. 1, in accordance with an illustrative embodiment.

FIG. 12 shows the root mean square (RMS) power generation of a bi-stable beam (e.g., a beam that is pre-compressed to buckling) of an illustrative embodiment of beam 204. As shown in FIG. 12, at high amplitude (e.g., high g, here 3 g) the power output increases sharply (e.g., jumps up) for vibrations between 60 Hz to 70 Hz. Thus, described bi-stable embodiments generate power at low frequencies (e.g., frequencies below 100 Hz), corresponding to the hardening response and lower stiffness of the beam.

Figure 13:
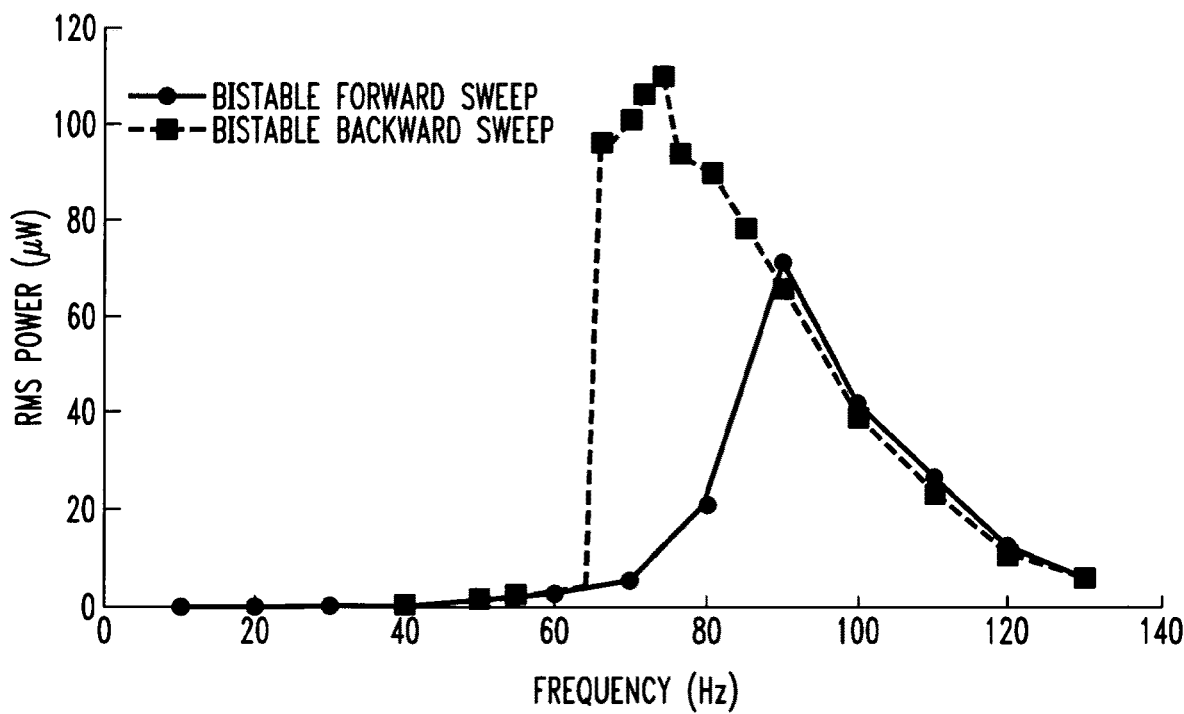
FIG. 13 is another plot showing root mean square (RMS) power output versus frequency of vibration applied to the multi-layer beam of the MEMS vibration energy harvester of FIG. 1, in accordance with an illustrative embodiment.

FIG. 13 shows that at low input acceleration amplitude (1 g), the bi-stable beam has a softening response. The jump up (e.g., rapid increase) of the power output during forward frequency sweep from 30 Hz to 100 Hz, and the jump down (e.g., rapid decrease) of the power output during backward frequency sweep from 100 Hz to 30 Hz shows hysteresis of the beam's response. As shown in FIGS. 12 and 13, the softening response of the bi-stable beam generates relatively high power with high bandwidth.

Figure 14:
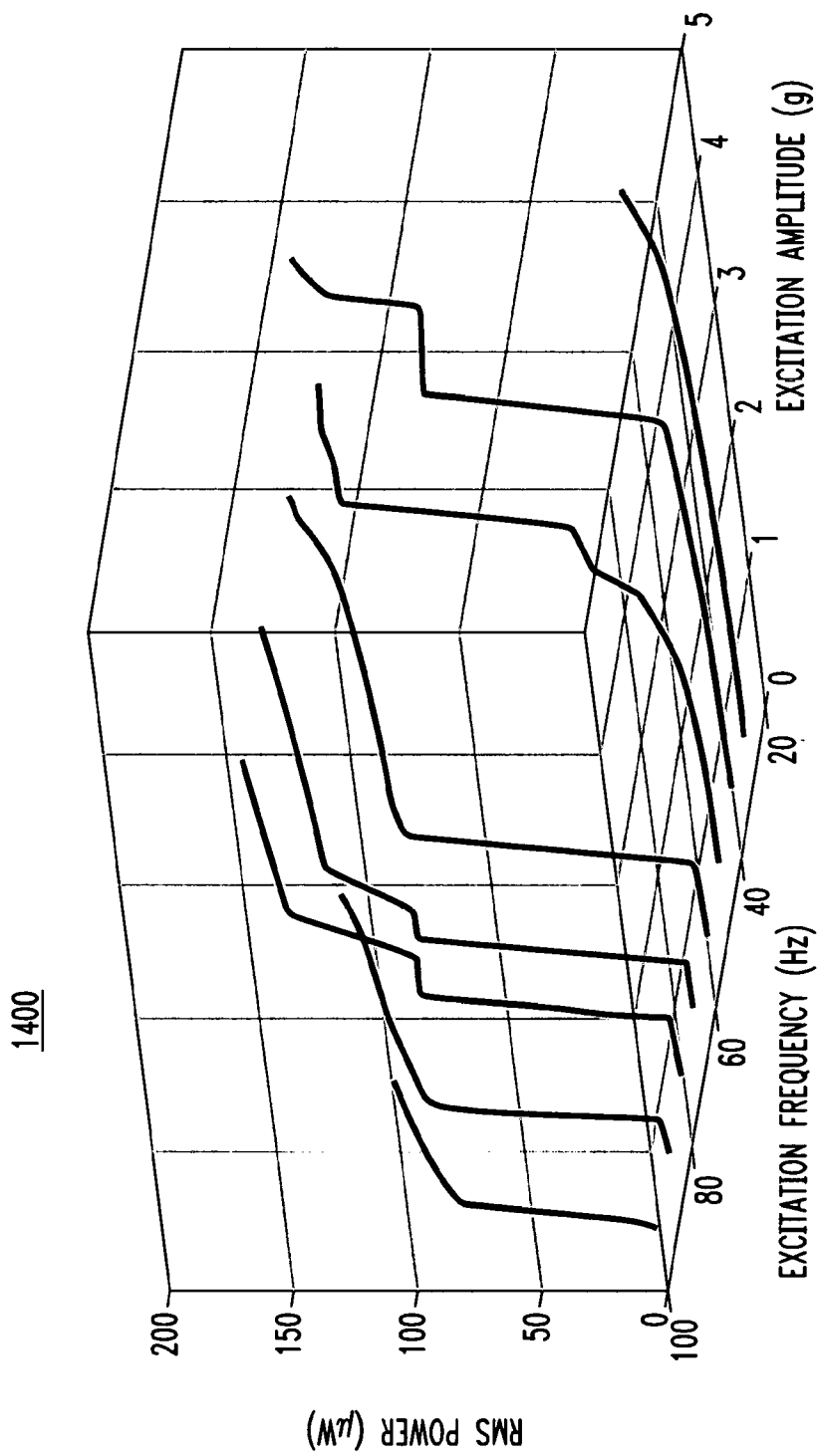
FIG. 14 is a plot showing root mean square (RMS) power output versus frequency of vibration versus acceleration amplitude of vibration applied to the multi-layer beam of the MEMS vibration energy harvester of FIG. 1, in accordance with an illustrative embodiment.
Figure 15:
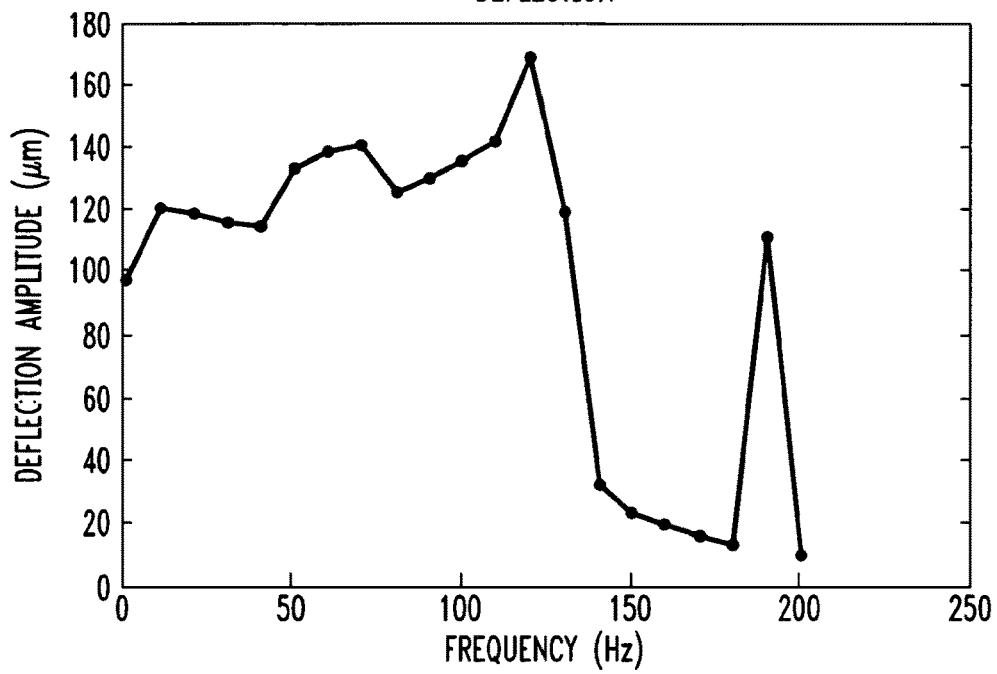
FIG. 15 is a plot showing deflection amplitude versus frequency of vibration applied to the multi-layer beam of the MEMS vibration energy harvester of FIG. 1, in accordance with an illustrative embodiment.
Figure 16:
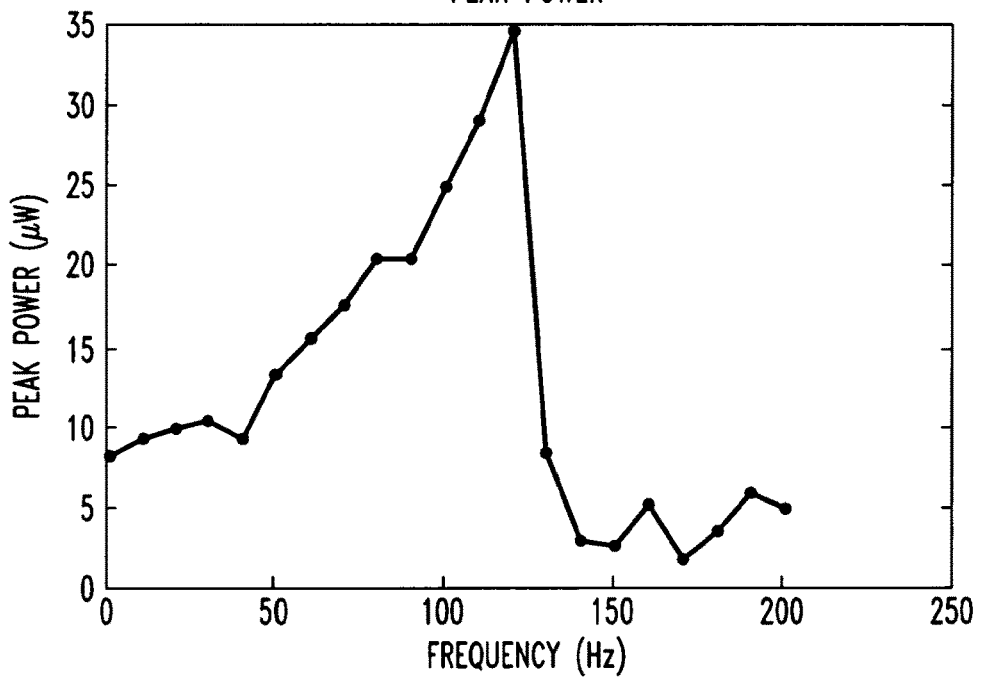
FIG. 16 is a plot showing peak power output versus frequency of vibration applied to the multi-layer beam of the MEMS vibration energy harvester of FIG. 1, in accordance with an illustrative embodiment.

The bi-stable beam also achieves hysteresis during sweeping input acceleration amplitude. As shown in FIG. 14, for fixed input vibration frequencies, sweeping the acceleration amplitude from 0.5 g to 4.5 g (forward sweep) and 4.5 g to 0.5 g (backward sweep), hysteresis exists when the acceleration amplitude is high enough to excite the inter-well oscillation. Deflection amplitude and peak power output versus frequency may be as shown in FIGS. 15 and 16, respectively.

As described herein, compression of beam 204 introduces negative stiffness (e.g., as given by Equation (1)). Since nonlinear stiffness does not change with the increasing compressive load, the total effective stiffness decreases due to the introduced negative linear stiffness, which results in lower resonance frequency of beam 204. Larger compression results in smaller stiffness, and hence lower working frequency range. However, large negative linear stiffness also increases the energy barrier, which increases the input acceleration amplitude required to excite inter-well oscillation of the beam. Therefore, the compression may be selected to match the frequency and amplitude of the applied environment vibrations. Due to having two potential wells with an energy barrier, a bi-stable beam oscillates intra-well with small amplitude until the input acceleration is high enough to overcome the energy barrier to excite the large-amplitude inter-well oscillation of the beam, which results in power output jump up. Further, when beam 204 is oscillating inter-well, the beam is able to maintain the large-amplitude inter-well oscillation and the high power output as the input acceleration amplitude is reducing. In some embodiments, to support low input acceleration amplitude (e.g., low-g, such as below 0.5 g) operation, an actuation and control unit may be employed to initiate inter-well oscillation of the beam.

As described herein, beam 204 may operate at low-frequency by changing the compression load in the doubly clamped beam. For example, residual stress inherently exists from the fabrication process in MEMS-scale thin films. For example, by changing the deposition gas ratio, a given thin film material can include either compressive or tensile residual stress. Therefore, to lower the stiffness and introduce more compressive stress, compressive materials (e.g., $Si_3N_4$) could be used as the structural layer of beam 204. For example, PECVD $Si_3N_4$ may be employed as an elastic substrate since it has compressive residual stress and can be altered over a wide range. The thickness of other layers is selected to make the beam buckle at desired frequencies and acceleration amplitudes.

For example, referring back to FIG. 5, in one embodiment, silicon dioxide layer 502 may have a thickness of 1400 nm and a residual stress of −200 MPa, piezoelectric layer 508 may have a thickness of 500 nm and a residual stress of 695 MPa, zirconium oxide ($ZrO_2$) layer 512 may have a thickness of 260 nm and a residual stress of 365 MPa, layer 514 may have a thickness of 400 nm and a residual stress of −40 MPa, $Si_3N_4$ layer 516 may have a thickness of 1000 nm and a residual stress of −100 MPa, and $SiO_2$ layer 518 may have a thickness of 300 nm and a residual stress of −300 MPa.

When proof mass 206 is a tungsten proof mass of 0.6 grams, at 1 g acceleration amplitude of the external vibrations, beam 204 has large deflection and a high power output in a wide frequency range between approximately 60 Hz and 120 Hz, as shown in FIG. 15 (deflection versus frequency) and 16 (power output versus frequency).

Referring back to FIG. 11, when the total stress in beam 204 is compressive and beyond the Euler buckling limit, clamped-clamped beam 204 will buckle, either upward or downward (e.g., inter-well oscillations), so that the system becomes bi-stable (e.g., as shown by illustrative beam 204').

As described herein beam 204 may be implemented as a clamped-clamped beam structure of a stack of thin films including a structural layer, a seed layer, a piezoelectric layer and one or more passivation layers, such as shown in FIGS.

4-7. Proof mass 206 may be located at (or proximate to) the middle of beam 204 to capture the external vibration and excite the beam to vibrate out-of-plane (e.g., along the z-axis). Piezoelectric elements operate in d33 mode, for example with top interdigitated electrodes as shown in FIG. 6, which generate electrical energy in response to the mechanical vibrations and oscillations of the beam. As described herein, beam 204 is designed to buckle by incorporating the controlled compressive residual stress of microfabricated thin films of the beam. Statically, the beam either buckles up or down (two equilibriums as shown in FIG. 11).

Figure 17B:
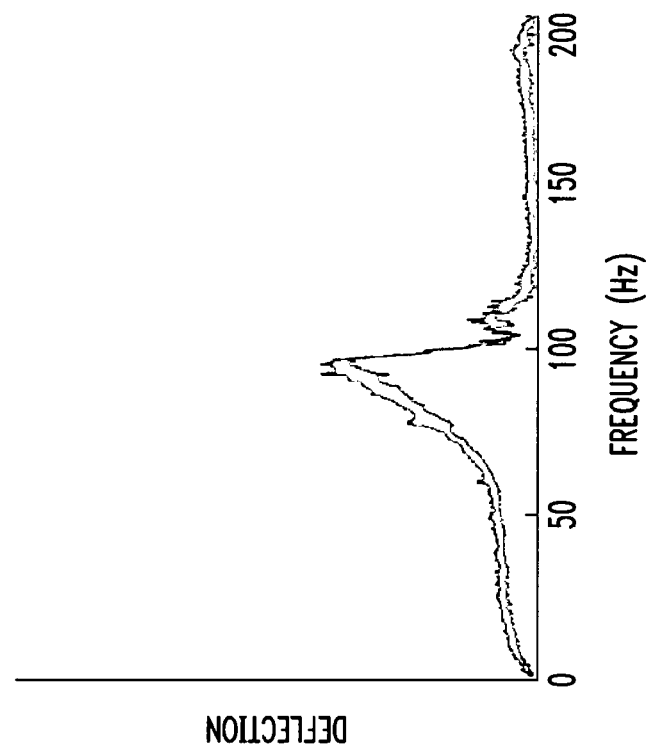
FIGS. 17A and 17B are plots showing deflection amplitude versus frequency of vibration applied to the multi-layer beam of the MEMS vibration energy harvester of FIG. 1 without an external proof mass, in accordance with an illustrative embodiment.
Figure 17A:
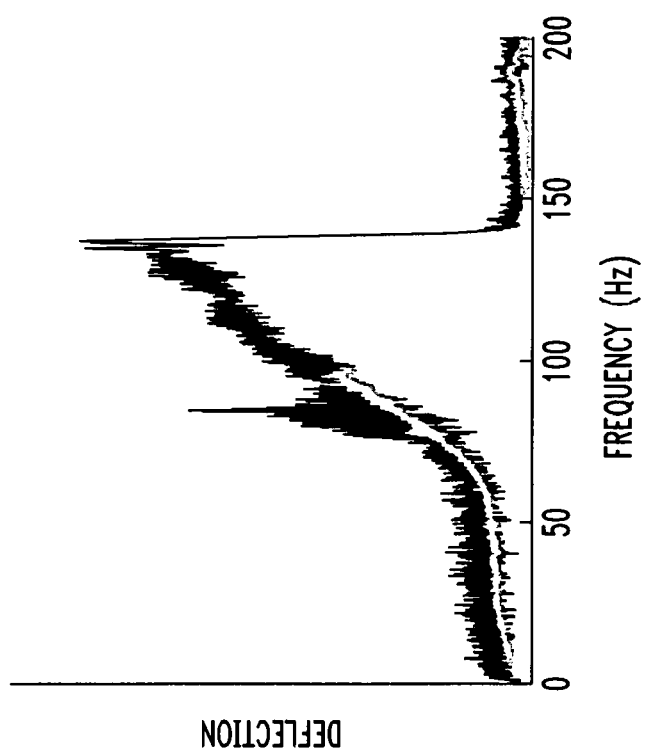

FIGS. 17A and 17B show plots of the deflection of beam 204, without proof mass 206, versus vibration frequency swept forward (FIG. 17A) from 0 Hz to 200 Hz and swept backward (FIG. 17B) from 200 Hz to 0 Hz at a vibration acceleration amplitude of 0.2 g. As shown in FIG. 17A, during forward frequency sweep, the beam center deflection increases gradually and jumps down at 140 Hz. As shown in FIG. 17B, during backward frequency sweep the beam center deflection jumps up at 100 Hz. The spring stiffening response has a wide bandwidth below 150 Hz.

FIG. 18 shows a plot of beam deflection versus vibration frequency when an external proof mass of 0.24 g is attached to the backside of the beam. As shown in FIG. 18, adding the proof mass (e.g., proof mass 206) to the beam (e.g., beam 204) shifted the frequency response to lower frequencies (e.g., versus FIGS. 17A and 17B), for example below approximately 20 Hz. This shift of frequency response, and also the increase in deflection amplitude, is due to the heavier mass added by the external proof mass. As shown in FIG. 18, the large-amplitude deflection region is below 10 Hz.

Figure 19:
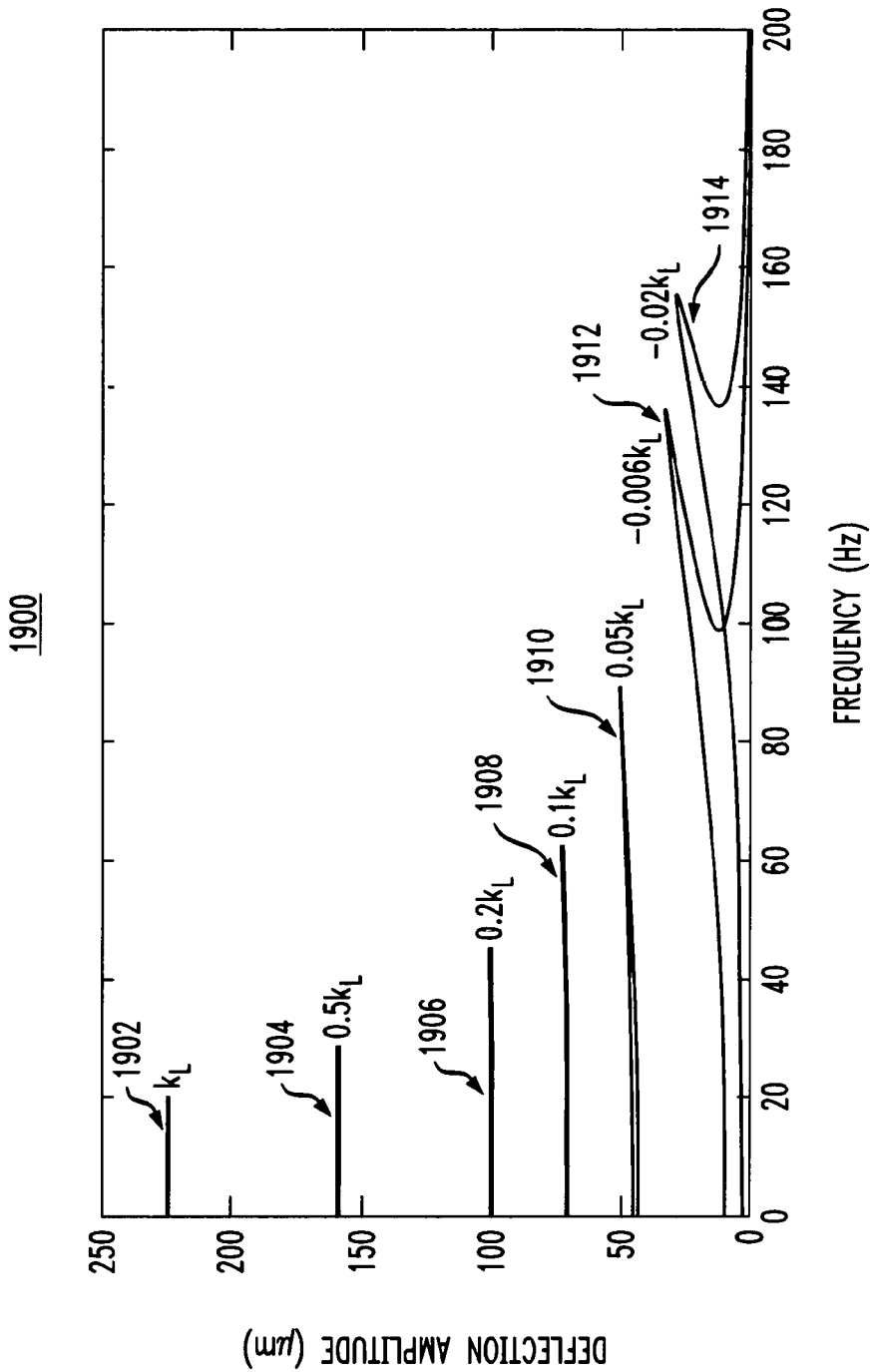
FIG. 19 is a plot showing deflection amplitude versus frequency of vibration with varying stiffness of the multi-layer beam of the MEMS vibration energy harvester of FIG. 1, in accordance with an illustrative embodiment.

FIG. 19 is a plot of deflection amplitude versus vibration frequency with varying stress in the structure of beam 204. As shown, the linear stiffness of beam 204 changes from positive (e.g., curves 1902, 1904, 1906, 1908 and 1910) to negative (e.g., curves 1912 and 1914). As shown, the resonance curves shift to lower frequency and higher amplitude with the decreasing linear stiffness, and when the linear stiffness becomes negative, the response is in a very low frequency range with large amplitude, which is a result of the large-amplitude snap through due to the non-linear bi-stability of beam 204. As shown in FIG. 19, la, is the real linear stiffness of the beam, and varying the linear stiffness in the beam changes the deflection response of the beam.

Beam 204 may experience buckling in multiple axes. For example, beam 204 may have bi-axial residual stress in the beam structure since the beam has built in compression in both the longitudinal direction (e.g., along the x-axis) and transverse direction (e.g., along the y-axis), which make the beam buckle in both directions (e.g., along both the x-axis and the y-axis as shown in FIGS. 2, 3 and 8).

To prevent buckling of the beam in the lateral direction, the critical buckling load of the beam structure is determined such that the built-in compression is made lower than the critical load. As will be described herein, critical buckling load increases as the beam width decreases.

Figure 20:
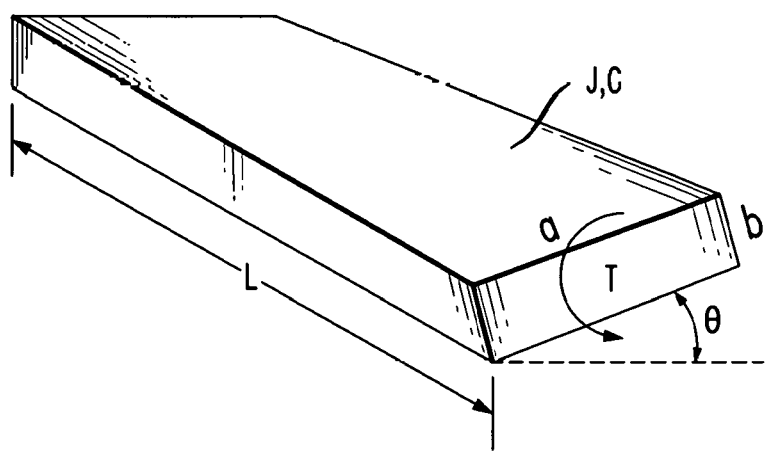
FIG. 20 is a diagram illustrating torsion of the multi-layer beam of the MEMS vibration energy harvester of FIG. 1.

FIG. 20 is a diagram illustrating torsion of beam 204. Torsion or rotation of beam 204 is undesirable, and tends to increase as the width of the beam is decreased. This is due to the smaller width and hence lower torsion constant J. As shown in FIG. 20, the torsion is given by $$T = \frac{GJ\theta}{L},$$

wherein J is the torsion constant, G is the shear modulus, L is the length of the beam, and $\theta$ is the twist angle. Further, torsion constant J is given by $J=\frac{1}{3}ab^3$, where a is the width of the beam and b is the thickness of the beam. As shown in FIG. 20, to restrain the rotation about the longitudinal axis so the bi-stable snap could dominate the dynamic response, the width of the plate should be increased. However, to reduce buckling in the lateral direction, the width of the beam should be decreased.

Finite element analysis on rectangular beams of various widths with lateral compression suggest that a beam width of 0.3 mm exhibits desired performance characteristics. For example, a beam width of 0.3 mm coupled to a proof mass has minimal lateral buckling and also restrains rotation of a beam array (e.g., as shown in FIG. 8) around the longitudinal axis to maximize the synchronized out-of-plane translational deflection and power output. Thus, in some described embodiments, a balance of the residual stress is achieved such that the bending moment due to residual stress about the neutral axis of the beam is minimized while the effective stress in the beam is compressive and larger than the critical buckling load.

Theoretical modeling of the dynamics of the beam become complex when the beam is continuously excited post-buckling. The beam vibration mode has been assumed so that a one degree-of-freedom model can be constructed. The non-homogeneous beam structure is accounted for by considering the different thickness and material properties of each layer of the beam. Furthermore, residual stress of each layer is built in as part of the stiffness of the beam to induce buckling. The electrical and mechanical domains are both linearly and non-linearly coupled, so that the generated electrical power can be calculated.

A lumped parameter model of the beam can be formulated by Lagrange's method. The Lagrangian, L, is defined as L=T−V, where T is the kinetic energy of the system and V is the potential of the system. In embodiments where the proof mass (e.g., proof mass 206) is much heavier than the distributed mass of the beam (e.g., beam 204), the kinetic energy of the beam can be simplified as that of the center-concentrated proof mass, such that $T=\frac{1}{2}m\dot{w}^2$, where m is the proof mass and $\dot{w}$ is the time derivative of the beam center displacement (e.g., the velocity of the proof mass).

To find out the thermodynamic potential of the system including the piezoelectric material, we start by considering the electrical enthalpy volume density given by:

$$\tilde{H}_e = \frac{1}{2}T_3 S_3 - \frac{1}{2}E_3 D_3 \quad (4)$$

and piezoelectric constitutive equations in $d_{33}$ mode, given by:

$$T_3 = c_{33}^E S_3 - E_3 e_{33} \quad (5)$$

$$D_3 = e_{33} S_3 + \varepsilon_{33}^S E_3 \quad (6)$$

where $T_3$, $S_3$, $D_3$, and $E_3$ are the stress, strain, electric displacement and electric field in 3-direction respectively, and $c_{33}^E$, $e_{33}$ and $\varepsilon_{33}^S$ are the elastic modulus, piezoelectric constant, and permittivity of the piezoelectric material. Here, the superscripts E and S denote that the parameters are at constant electric field and strain respectively. Substituting $T_3$ and $D_3$ into Equation 4, and adding the strain energy contributed by the residual stress $T_0$, results in the electrical enthalpy volume density being given by:

$$\tilde{H}_e = \frac{1}{2}c_{33}^E S_3^2 - e_{33}E_3 S_3 - \frac{1}{2}\varepsilon_{33}^S E_3^2 + T_0 S_3 \quad (7)$$

The Lagrangian of the system can now be evaluated by integrating the enthalpy density over the beam's volume layer by layer (e.g., for each layer 702 of beam 204 as shown in FIG. 7), and is given by:

$$L = \frac{1}{2}m\dot{w}^2 - \sum_{i=1}^{n} \int\int_{V_i}\int \tilde{H}_{e,i} dV \qquad (8)$$

where $V_i$ is the volume of i-th layer of the beam and n is the total number of layers of the beam.

The strains developed in the beam should be evaluated before carrying out the integrations in Equation 8. The total strain, $S_T$, developed in the beam has two components: bending strain, which changes linearly across the beam thickness, and axial strain due to large deflection tension. The total strain, $S_T$, is given by:

$$S_T = -z\frac{d^2\hat{w}}{dx^2} + \frac{1}{L}\int_{-L/2}^{L/2}\frac{1}{2}\left(\frac{d\hat{w}}{dx}\right)^2 dx \qquad (9)$$

where L is the beam length. The beam vibrates up and down along the z-axis, and by assuming that the beam vibrates predominantly in one mode, simplification can be made when evaluating the lumped parameters. The first buckling mode of the beam is adopted, which satisfies the boundary conditions of a clamped-clamped beam. The deflection of the beam can then be separated into time and space and is given by:

$$\hat{w} = \frac{w(t)}{2}\left(1 + \cos\frac{2\pi x}{L}\right) \qquad (10)$$

where w(t) is the deflection of the beam center varying with time. The Lagrange equations are given by:

$$\frac{d}{dt}\left(\frac{\partial L}{\partial \dot{\xi}_i}\right) - \frac{\partial L}{\partial \xi_i} = Q_i^{Force} + Q_i^{Dissipation} \qquad (11)$$

where $\xi_i$ is the i-th independent generalized coordinate, $Q_i^{Force}$ and $Q_i^{Dissipation}$ are the generalized external force and the generalized dissipative force, respectively. Selecting the deflection of the mid-point of the beam w and the output voltage V as the generalized coordinates, the Lagrange equation with respect to the first coordinate w is then given by:

$$\frac{d}{dt}\left(\frac{\partial L}{\partial \dot{w}}\right) - \frac{\partial L}{\partial w} = F - b\dot{w} \qquad (12)$$

Evaluating the integrations in Equation 8, and substituting into Equation 12, the governing equation of the mechanical domain can be given by Equation 2, above, where m, $k_L$, $k_N$, b and F are the proof mass, linear stiffness of the beam, non-linear stiffness of the beam, mechanical damping coefficient, and excitation force, $C_L$ and $C_N$ are constants that couple the two domains in linear and nonlinear relations respectively. The subscripts L and N denote the linear and nonlinear responses.

The linear stiffness of the beam, $k_L$, the non-linear stiffness of the beam, $k_N$, and the constants $C_L$ and $C_N$ are based upon the properties of the beam, and are given by:

$$k_L = \left[\frac{2\pi^4 W}{3L^3}\sum_{i=1}^{n}c_{33,i}^E(H_{U,i}^3 - H_{L,i}^3)\right] + \left[\frac{\pi^2 W}{2L}\sum_{i=1}^{n}T_{0,i}H_i\right] \qquad (13)$$

$$k_N = \frac{\pi^4 W}{8L^3}\sum_{i=1}^{n}c_{33,i}^E H_i \qquad (14)$$

$$C_L = \frac{\pi e_{33}W(H_{U,P}^2 - H_{L,P}^2)(\sin(2\pi b) - \sin(2\pi a))}{Lg} \qquad (15)$$

$$C_N = \frac{\pi^2 e_{33}WH_p(b-a)}{Lg} \qquad (16)$$

where W and H are the width and thickness of the layers the beam (e.g., as shown in FIG. 7), a and b denote the span of the electrodes on the beam (e.g., as shown in FIG. 6), since they do not cover the whole beam, and g is the gap between two electrode fingers (e.g., as shown in FIG. 6). The subscript p denotes the variable is associated with the piezoelectric layer of the beam. The linear stiffness has two parts: the first part based upon bending of the beam and the second part based upon the residual stress of the beam. More particularly, when the residual stress is negative (compressive) and large enough, the linear stiffness $k_L$ can be negative, so that Equation 2 becomes a characteristic bi-stable Duffing equation.

The second Lagrange equation with respect to the coordinate V is given by:

$$\frac{d}{dt}\left(\frac{\partial L}{\partial \dot{V}}\right) - \frac{\partial L}{\partial V} = \frac{\int V dt}{R} \qquad (17)$$

Taking the time derivative of Equation 17 gives the governing equation for the electrical domain, given by Equation 3, above, where $C_0$ and R are the internal capacitance of the piezoelectric element and the load resistance, V and I are the generated voltage and current, and where $I_L = C_L\dot{w}$ and $I_N = C_N w\dot{w}$ are two parts of the electrical current generated by piezoelectric element through coupling. The induced voltages on the electrodes are given by $V_L$ and $V_N$ due to the fact that they come from two parts of the current respectively and have different frequencies due to different coupling (e.g., linear and non-linear). The internal capacitance of the piezoelectric element, $C_0$, is given by:

$$C_0 = \frac{2WLH_p(b-a)\varepsilon_{33}^s}{g^2}. \qquad (18)$$

The nonlinear governing Equations 2 and 3 could be numerically integrated to obtain the solution in time domain, but analytical solutions provide more insights on the dynamic behavior. Further, the explicit relations between system parameters and the performance are significant for design of the beam. Therefore, the heuristic harmonic balance method is adopted to approximate the frequency response analytically.

Table 1 gives a set of assumed functions for analytical solution of Equations 2 and 3. In Table 1, the subscript 0 denotes amplitude, and the subscripts L and N denote linear and nonlinear coupling.

TABLE 1

Assumed Parameters Expressions

| Parameters | Assumed Functions |
|---|---|
| Input Force* | $F = F_0 \sin(\omega t + \phi) = m \cdot a \sin(\omega t + \phi)$ |
| Beam Mid-point Displacement | $w = \delta + w_0 \sin(\omega t)$ |
| Current (Inter-well) | $I = I_L + I_N = I_{0,L} \cos(\omega t) + I_{0,N} \sin(2\omega t)$ |
| Current (Intra-well) | $I = I_L + I_N = I_{0,L} \cos(\omega t) + I_{0,N1} \sin(2\omega t) + I_{0,N2} \cos(\omega t)$ |
| Voltage (Inter-well) | $V = V_L + V_N = V_{0,L} \cos(\omega t - \alpha) + V_{0,N} \sin(2\omega t - \beta)$ |
| Voltage (Intra-well) | $V = V_L + V_N = V_{0,L} \cos(\omega t - \alpha) + V_{0,N1} \sin(2\omega t - \beta) + V_{0,N2} \cos(\omega t - \alpha)$ |

*m and a are the proof mass and excitation amplitude (acceleration amplitude).

As described herein, the bi-stable beam has a double potential well characteristic. If the beam has enough energy to overcome the energy barrier, it crosses the well and has inter-well oscillation. Otherwise, if the beam does not have enough energy, it stays in one well and oscillates intra-well. To differentiate the two modes of oscillations, we assumed beam mid-point deflection with bias δ so that the bi-stable beam oscillates around the buckled equilibrium (intra-well) around nonzero δ. When δ is zero, the oscillator moves symmetrically around the flat position (inter-well). For intra-well oscillations, using the assumed functions from Table 1 in Equation 2, δ, which is a function of the deflection amplitude, can be given by:

$$\delta = \sqrt{-\frac{k_L}{k_N} - \frac{3}{2}w_0^2} \quad (19)$$

By assuming the external force is sinusoidal and continuous, from trigonometric relations, it is found that the frequencies of the induced electrical currents are related to each other by a factor of 2. Physically, this relationship is due to the developed stretching strain having a cycle that is half of the bending strain. The induced electrical current and voltage are then written in different parts with different frequencies, such as shown in Table 1. Writing Equation 3 into two separate equations, $V_L$ and $V_N$ can be separately determined:

$$C_0 \dot{V}_L + \frac{V_L}{R} = C_L \dot{w} \quad (20)$$

$$C_0 \dot{V}_N + \frac{V_N}{R} = C_N w \dot{w} \quad (21)$$

Based upon Equations 20 and 21, the amplitudes of voltages and the phase constants can be found by:

$$V_{0,L} = \frac{C_L R \omega}{\sqrt{1 + C_0^2 R^2 \omega^2}} w_0 \quad (22)$$

$$V_{0,N1} = \frac{C_N R \omega}{2\sqrt{1 + 4C_0^2 R^2 \omega^2}} w_0^2 \quad (23)$$

$$V_{0,N2} = \frac{C_N R \omega w_0}{\sqrt{1 + 4C_0^2 R^2 \omega^2}} \cdot \sqrt{-\frac{k_L}{k_N} - \frac{3}{2}w_0^2} \quad (24)$$

$$\sin(\alpha) = \frac{C_0 R \omega}{\sqrt{1 + C_0^2 R^2 \omega^2}} \cdot \cos(\alpha) = \frac{1}{\sqrt{1 + C_0^2 R^2 \omega^2}} \quad (25)$$

$$\sin(\beta) = \frac{2 C_0 R \omega}{\sqrt{1 + 4C_0^2 R^2 \omega^2}} \cdot \cos(\beta) = \frac{1}{\sqrt{1 + 4C_0^2 R^2 \omega^2}} \quad (26)$$

The voltage due to nonlinear coupling is a function of the deflection amplitude squared, and the voltage due to linear coupling is proportional to the deflection amplitude. This indicates that when the deflection is beyond some point, the non-linear response will dominate the total response.

Substituting assumed functions listed in Table 1 into Equation 2, two equations can be derived:

$$A w_0^3 + B w_0 = F_0 \cos(\phi) \quad (27)$$

$$C w_0^3 + D w_0 = F_0 \sin(\phi) \quad (28)$$

From Equations 27 and 28, a single equation with a single unknown, $w_0$, can be determined:

$$(A_2 + C^2) w_0^6 + 2(A \cdot B + C \cdot D) w_0^4 + (B^2 + D^2) w_0^2 - E = 0 \quad (29)$$

where variables, A, B, C, D, and E are functions of the beam's physical parameters, given by:

$$A = \frac{\begin{pmatrix} -\frac{15}{4} k_N - C_N^2 C_0 R^2 \omega^2 - \frac{75}{4} C_0^2 k_N R^2 \omega^2 - \\ \frac{11}{2} C_0^3 C_N^2 R^4 \omega^4 - 15 C_0^4 k_N R^4 \omega^4 \end{pmatrix}}{(1 + C_0^2 R^2 \omega^2)(1 + 4 C_0^2 R^2 \omega^2)} \quad (30)$$

$$B = \frac{\begin{bmatrix} -m\omega^2 - 2k_L + C_L^2 C_0 R^2 \omega^2 - 10 C_0^2 k_L R^2 \omega^2 - \\ C_0 C_n^2 k_L R^2 \omega^2 / k_N - 5 C_0^2 m R^2 \omega^4 + 4 C_0^3 C_L^2 R^4 \omega^4 - \\ 8 C_0^4 k_L R^4 \omega^4 - 4 C_0^3 C_n^2 k_L R^4 \omega^4 / k_N - 4 C_0^4 m R^4 \omega^6 \end{bmatrix}}{(1 + C_0^2 R^2 \omega^2)(1 + 4 C_0^2 R^2 \omega^2)} \quad (31)$$

$$C = -\frac{3 C_N^2 R \omega}{2(1 + C_0^2 R^2 \omega^2)} + \frac{C_N^2 R \omega}{4(1 + 4 C_0^2 R^2 \omega^2)} \quad (32)$$

$$D = b\omega + \frac{C_L^2 R \omega}{1 + C_0^2 R^2 \omega^2} - \frac{C_N^2 k_L R \omega}{k_N (1 + C_0^2 R^2 \omega^2)} \quad (33)$$

$$E = (m \cdot a)^2 \quad (34)$$

The inter-well oscillation is symmetric with respect to the flat unbuckled position of the beam, and hence there is no bias in w(t). Solving Equations 2, 20 and 21 in the same way as for the intra-well case but with δ=0, the coefficients for the inter-well case for Equation 29 are determined as:

$$A = \frac{3}{4} k_N + \frac{C_0 C_N^2 R^2 \omega^2}{2(1 + 4 C_0^2 R^2 \omega^2)} \quad (35)$$

$$B = -m\omega^2 + k_L + \frac{C_0 C_L^2 R^2 \omega^2}{1 + C_0^2 R^2 \omega^2} \quad (36)$$

$$C = \frac{C_N^2 R \omega}{4(1 + 4 C_0^2 R^2 \omega^2)} \quad (37)$$

$$D = b\omega + \frac{C_L^2 R \omega}{1 + C_0^2 R^2 \omega^2} \quad (38)$$

$$V_{0,L} = \frac{C_L R \omega}{\sqrt{1 + C_0^2 R^2 \omega^2}} w_0 \quad (39)$$

$$V_{0,N} = \frac{C_N R \omega}{2\sqrt{1 + 4C_0^2 R^2 \omega^2}} w_0^2 \quad (40)$$

Since the voltages are functions of $w_0$, the generated power, P, can be calculated by assuming the harvester is connected to a resistive load, R, as $$P = \frac{V^2}{R}.$$

By solving Equation 29 for intra-well and inter-well cases, two sets of solutions are obtained, which correspond to the two modes of oscillations (e.g., inter-well and intra-well oscillations shown in FIG. 11). The jumps and tilt of the two curves shown in FIG. 11 show that the two modes of oscillations have characteristic softening and stiffening frequency responses. The softening response tilts to lower frequencies, which can be used for low-frequency energy harvesting at low g's (e.g., low vibration acceleration amplitude). When the input excitation is strong enough, the beam can snap between two buckled positions and the inter-well oscillation is triggered (e.g., high vibration acceleration amplitude). The stiffening response has shifted frequency response with large amplitude and, thus, increases the power output of the energy harvester at low frequencies.

Thus, as described herein, some embodiments provide MEMS vibration energy harvesting system to provide energy to low-power microelectronic systems and potentially enable batteryless autonomous systems by generating energy based upon external vibration of the system. The described MEMS vibration energy harvesters have small physical size, allowing the MEMS energy harvesters to be embedded in small electronic systems, such as mobile devices. In some embodiments, piezoelectric energy harvesting may be employed to convert kinetic energy of ambient vibrations to electrical power. The MEMS energy harvester described herein employs one or more micro-fabricated thin film beams having at least a compressive residual stress to achieve a bi-stable energy harvester suitable for low frequency, low amplitude (e.g., low g) vibration energy harvesting. In described embodiments, the compressive residual stress in micro-fabricated thin films may be employed to induce buckling in doubly clamped or clamped-clamped beams. The clamped-clamped beams are bi-stable (e.g., have two equilibrium points) and snap through at low frequencies to achieve increased power generation.

Reference herein to "one embodiment" or "an embodiment" means that a particular feature, structure, or characteristic described in connection with the embodiment can be included in at least one embodiment of the claimed subject matter. The appearances of the phrase "in one embodiment" in various places in the specification are not necessarily all referring to the same embodiment, nor are separate or alternative embodiments necessarily mutually exclusive of other embodiments. The same applies to the term "implementation."

As used in this application, the words "exemplary" and "illustrative" are used herein to mean serving as an example, instance, or illustration. Any aspect or design described herein as "exemplary" or "illustrative" is not necessarily to be construed as preferred or advantageous over other aspects or designs. Rather, use of the words "exemplary" and "illustrative" is intended to present concepts in a concrete fashion.

To the extent directional terms are used in the specification and claims (e.g., upper, lower, parallel, perpendicular, etc.), these terms are merely intended to assist in describing the embodiments and are not intended to limit the claims in any way. Such terms, do not require exactness (e.g., exact perpendicularity or exact parallelism, etc.), but instead it is intended that normal tolerances and ranges apply. Similarly, unless explicitly stated otherwise, each numerical value and range should be interpreted as being approximate as if the word "about", "substantially" or "approximately" preceded the value of the value or range.

Unless explicitly stated otherwise, each numerical value and range should be interpreted as being approximate as if the word "about", "substantially" or "approximately" preceded the value of the value or range.

Various elements, which are described in the context of a single embodiment, may also be provided separately or in any suitable subcombination. It will be further understood that various changes in the details, materials, and arrangements of the parts that have been described and illustrated herein may be made by those skilled in the art without departing from the scope of the following claims.

We claim:

1. A Micro-Electro-Mechanical System (MEMS) vibration energy harvester comprising:
    a buckled multi-layer beam comprising a plurality of stacked layers, the plurality of stacked layers comprising at least one piezoelectric layer, each one of the plurality of stacked layers having a determined stress level and a determined thickness, the determined stress level comprising at least a compressive stress, the plurality of stacked layers configured to achieve a desired total stress level of the multi-layer beam, the desired total stress level to achieve substantial deformation of the buckled multi-layer beam in at least one direction when a proof mass up to the order of $10^0$ grams is added to the beam,
    wherein, in response to applied external vibrations having a vibration frequency less than approximately 100 Hz and an acceleration amplitude of less than approximately 0.5 g, the buckled multi-layer beam deflects and deforms to provide a greater than 0.05% strain to the at least one piezoelectric layer, thereby generating an electrical charge to provide a continuous power output in response to the external vibrations.

2. The MEMS vibration energy harvester of claim 1, wherein a first subset of the plurality of layers comprise transduction layers, a second subset of the plurality of layers comprise electrode layers, and a third subset of the plurality of layers comprise substrate layers.

3. The MEMS vibration energy harvester of claim 1, wherein the multi-layer beam is suspended from a base frame, the base frame thicker than the multi-layer beam, the base frame configured to provide support to the multi-layer beam during vibration, and wherein the multi-layer beam comprises the proof mass proximate to a center of the multi-layer beam.

4. The MEMS vibration energy harvester of claim 3, wherein the buckled multi-layer beam is configured to achieve bi-stable non-linear oscillation in response to the external vibrations.

5. The MEMS vibration energy harvester of claim 4, wherein the energy harvester is configured to generate at least 100 µW continuous power in response to the external vibrations.

6. The MEMS vibration energy harvester of claim 2, wherein the transduction layers comprise at least one piezoelectric layer comprising piezoelectric material.

7. The MEMS vibration energy harvester of claim 6, wherein the piezoelectric material is selected from the group consisting of: lead zirconate titanate (PZT), barium titanate ($BaTiO_3$), zinc oxide (ZnO), aluminum nitride (AlN), polyvinylidene difluoride (PVDF), and lead magnesium niobate-lead titanate (PMN-PT).

8. The MEMS vibration energy harvester of claim 6, wherein the transduction layers comprise one or more support layers, the support layers comprising one of a seed layer and a diffusion barrier.

9. The MEMS vibration energy harvester of claim 1, wherein the determined stress level and the determined thickness are selected to induce buckling of the multi-layer beam when a total compression in the multi-layer beam is higher than a critical buckling load of the multi-layer beam.

10. The MEMS vibration energy harvester of claim 1, wherein the determined stress level and the determined thickness are selected to achieve symmetric distribution of stress across the multi-layer beam with respect to a neutral axis of the multi-layer beam, thereby enabling the multi-layer beam to buckle in two directions.

11. The MEMS vibration energy harvester of claim 3, wherein the plurality of layers comprises one or more passivation layers, one or more active layers, one or more diffusion barriers, one or more substrate layers, one or more electrode layers, and one or more seed layers, the plurality of layers having a total thickness less than approximately 4 µm.

12. The MEMS vibration energy harvester of claim 1, wherein the energy harvester comprises a suspended structure comprising one or more rows, each row comprising one or more multi-layer beams, each multi-layer beam having a (length/thickness) aspect ratio higher than $10^3$.

13. The MEMS vibration energy harvester of claim 12, wherein each multi-layer beam has a width dimension selected to reduce buckling in a direction lateral to the multi-layer beam, while allowing buckling in a direction longitudinal to the multi-layer beam.

14. The MEMS vibration energy harvester of claim 13, the multi-layer beams are coupled to the proof mass to thereby reduce a rotation of the suspended structure about a rotation axis in relation to the longitudinal direction of the multi-layer beams.

15. The MEMS vibration energy harvester of claim 14, wherein a material of each of the plurality of layers is selected from the group consisting of: silicon, silicon dioxide, silicon nitride, gold, titanium, platinum, copper, aluminum, tungsten, piezoelectric material, silver, plastic, polymers, and zirconium dioxide, and wherein each of the plurality of layers has a thickness in the range of approximately 10 nm to approximately 50 µm.

\* \* \* \* \*